United States Patent
Petre et al.

(10) Patent No.: US 10,128,820 B2
(45) Date of Patent: Nov. 13, 2018

(54) COGNITIVE SIGNAL PROCESSOR FOR SIMULTANEOUS DENOISING AND BLIND SOURCE SEPARATION

(71) Applicant: HRL Laboratories, LLC, Malibu, CA (US)

(72) Inventors: Peter Petre, Oak Park, CA (US); Bryan H. Fong, Los Angeles, CA (US); Shankar R. Rao, Agoura Hills, CA (US); Charles E. Martin, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/817,906

(22) Filed: Nov. 20, 2017

(65) Prior Publication Data

US 2018/0076795 A1 Mar. 15, 2018

Related U.S. Application Data

(63) Continuation-in-part of application No. 15/452,155, filed on Mar. 7, 2017, which is a continuation-in-part
(Continued)

(51) Int. Cl.
*H04B 1/00* (2006.01)
*H03H 21/00* (2006.01)
(Continued)

(52) U.S. Cl.
CPC ....... *H03H 21/0025* (2013.01); *G06K 9/0057* (2013.01); *G06K 9/624* (2013.01);
(Continued)

(58) Field of Classification Search
CPC ....... H03H 21/0025; H03H 2021/0034; G06N 3/0445; H04B 1/719; H04B 1/71632; G06K 9/624; G06K 9/0057
(Continued)

(56) References Cited

U.S. PATENT DOCUMENTS 5,694,474 A * 12/1997 Ngo ..................... G06K 9/0057
381/66
7,474,756 B2 1/2009 Ricard et al.
(Continued)

OTHER PUBLICATIONS

Igel, C. and Husken, M., "Improving the Rprop learning algorithm", in Proc. of the 2nd Int. Symposium on Neural Computation (NC'2000), pp. 115-121, ICSCD Academic Press, 2000.
(Continued)

*Primary Examiner* — Chieh M Fan
*Assistant Examiner* — Fitwi Hailegiorgis
(74) *Attorney, Agent, or Firm* — Tope-McKay & Associates

(57) ABSTRACT

Described is a cognitive signal processor for signal denoising and blind source separation. During operation, the cognitive signal processor receives a mixture signal that comprises a plurality of source signals. A denoised reservoir state signal is generated by mapping the mixture signal to a dynamic reservoir to perform signal denoising. At least one separated source signal is identified by adaptively filtering the denoised reservoir state signal.

27 Claims, 13 Drawing Sheets

Related U.S. Application Data of application No. 15/452,412, filed on Mar. 7, 2017, which is a continuation-in-part of application No. 15/073,626, filed on Mar. 17, 2016, now Pat. No. 9,749,007.

(60) Provisional application No. 62/135,539, filed on Mar. 19, 2015, provisional application No. 62/304,623, filed on Mar. 7, 2016, provisional application No. 62/447,883, filed on Jan. 18, 2017.

(51) Int. Cl.
| | |
|---|---|
| *G06K 9/00* | (2006.01) |
| *G06K 9/62* | (2006.01) |
| *H04B 1/7163* | (2011.01) |
| *H04B 1/719* | (2011.01) |
| *G06N 3/04* | (2006.01) |

(52) U.S. Cl.
CPC ........... *G06N 3/0445* (2013.01); *H04B 1/719* (2013.01); *H04B 1/71632* (2013.01); *H03H 2021/0034* (2013.01)

(58) Field of Classification Search
USPC ................................................ 375/130, 346
See application file for complete search history.

(56) References Cited

U.S. PATENT DOCUMENTS

| | | | | |
|---|---|---|---|---|
| 8,031,117 | B2* | 10/2011 | Goldberg | H04B 7/0854 342/377 |
| 9,042,496 | B1* | 5/2015 | Su | H04L 27/0012 375/346 |
| 2005/0047611 | A1 | 3/2005 | Mao | |
| 2005/0267377 | A1 | 12/2005 | Marossero | |
| 2010/0158271 | A1 | 6/2010 | Park et al. | |
| 2012/0207195 | A1 | 8/2012 | Kawasaki | |
| 2012/0232418 | A1* | 9/2012 | Kimura | A61B 5/02411 600/528 |
| 2013/0304395 | A1 | 11/2013 | Naidu | |
| 2016/0203827 | A1* | 7/2016 | Leff | G06T 13/40 704/207 |

OTHER PUBLICATIONS

Notification of Transmittal of International Search Report and the Written Opinion of the International Searching Authority for PCT/US2017/062561; dated Feb. 6, 2018.
International Search Report of the International Searching Authority for PCT/US2017/062561; dated Feb. 6, 2018.
Written Opinion of the International Searching Authority for PCT/US2017/062561; dated Feb. 6, 2018.
H. Jaeger, et al. "Harnessing nonlinearity: Predicting chaotic systems and saving energy in wireless communications," Science, vol. 304, No. 5667, pp. 78-80, 2004.
R. Legenstein, et al. "Edge of Chaos and Prediction of Computational Performance for Neural Microcircuit Models," Neural Networks, 20(3), pp. 323-334, 2007.
W. Maass, "Liquid Computing", Proc. of the Conference CiE'07: Computability in Europe 2007, Siena (Italy), pp. 507-516.
F. Takens, "Detecting Strange Attractors in Turbulence," Dynamical Systems and Turbulence, Lecture Notes in Mathematics vol. 898, 1981, pp. 366-381.
D. Verstraeten, et al. "An experimental unification of reservoir computing methods", Neural Networks, vol. 20, No. 3, Apr. 2007, pp. 391-403.
R. Walden, "Analog-to-digital converter survey and analysis," IEEE J. Sel. Areas Commun., vol. 51, pp. 539-548, 1999.
H. Yap, et al., "A First Analysis of the Stability of Takens' Embedding," in Proc. of the IEEE Global Conference on Signal and Information Processing (GlobalSIP) symposium on Information Processing for Big Data, Dec. 2014, pp. 404-408.
Office Action 1 for U.S. Appl. No. 15/452,412, dated May 10, 2017.
Response to Office Action 1 for U.S. Appl. No. 15/452,412, dated Aug. 9, 2017.
Office Action 2 for U.S. Appl. No. 15/452,412, dated Nov. 14, 2017.
Response to Office Action 2 for U.S. Appl. No. 15/452,412, dated Feb. 13, 2018.
Office Action 3 for U.S. Appl. No. 15/452,412, dated Mar. 7, 2018.
S. Choi, A. Cichocki, H.-M. Park, and S.-Y. Lee, "Blind Source Separation and Independent Component Analysis: A Review," Neural Information Processing—Letters, vol. 6, No. 1, Jan. 2005, pp. 1-57.
A. Cichocki and A. Belouchrani, "Sources separation of temporally correlated sources from noisy data using a bank of band-pass filters," in Proc. of Independent Component Analysis and Signal Separation (ICA-2001), pp. 173-178, San Diego, USA, Dec. 9-13, 2001.
A. Hyvarinen, "Complexity Pursuit: Separating Interesting Components from Time Series," Neural Computation, vol. 13, No. 4, pp. 883-898, Apr. 2001.
Igel, C. and Husken, M., "Improving the Rprop learning algorithm", in Proc. of the 2nd Int. Symposium on Neural Computation (NC'2000), pp. 115-121, ICSC Academic Press, 2000.
R. H. Walden, "Analog-to-digital converter survey and analysis," IEEE J. Sel. Areas Commun., vol. 51, pp. 539-548, 1999.
Office Action 1 for U.S. Appl. No. 15/073,626, dated Sep. 16, 2016.
Response to Office Action 1 for U.S. Appl. No. 15/073,626, dated Dec. 16, 2016.
Notice of Allowance for U.S. Appl. No. 15/073,626, dated Apr. 25, 2017.

\* cited by examiner

US 10,128,820 B2

COGNITIVE SIGNAL PROCESSOR FOR SIMULTANEOUS DENOISING AND BLIND SOURCE SEPARATION

CROSS-REFERENCE TO RELATED APPLICATIONS

The present application is a Continuation-in-Part Application of U.S. Non-Provisional application Ser. No. 15/452,412, filed on Mar. 7, 2017, which is a Continuation-in-Part Application of U.S. Non-Provisional application Ser. No. 15/073,626, filed on Mar. 17, 2016, which is a Non-Provisional Application of U.S. Provisional Patent Application No. 62/135,539, filed on Mar. 19, 2015, the entirety of which are incorporated herein by reference.

U.S. Non-Provisional application Ser. No. 15/452,412 is ALSO a Non-Provisional Application of U.S. Provisional Patent Application No. 62/304,623, filed Mar. 7, 2016, the entirety of which is incorporated herein by reference.

The present application is ALSO a Continuation-in-Part application of U.S. Non-Provisional application Ser. No. 15/452,155, filed on Mar. 7, 2017, which is a non-provisional application of U.S. Provisional Application No. 62/304,623, filed Mar. 7, 2016, the entirety of which are hereby incorporated by reference.

The present application is ALSO a non-provisional application of U.S. Provisional Application No. 62/447,883, filed on Jan. 18, 2017, the entirety of which is incorporated herein by reference.

GOVERNMENT RIGHTS

This invention wa made with government support under U.S. Government Contract Number N00014-12-C-0027. The government has certain rights in the invention.

BACKGROUND OF INVENTION

(1) Field of Invention

The present invention relates to blind source separator and, more specifically, to signal processor that denoises a mixed input signal and performs blind source separation on the input signal to extract and separate the signals.

(2) Description of Related Art

Blind signal separation, also known as blind source separation, is the separation of a set of source signals from a set of mixed signals (mixture signals), without the aid of information (or with very little information) about the source signals or the mixing process. Thus, in the Blind Source Separation (BSS) problem, any single antenna measures multiple source signals. There may be more than one antenna measuring the signals, but in general each antenna "sees" all of the source signals and creates a different linear mixture of them. The task is then to use the measured mixture signals in order to recover the original source signals. The case of a single antenna operating in isolation is especially challenging because there is no sense of spatial resolution to aid in the extraction process.

State-of-the-art systems for detecting, localizing, and classifying source emitters from passive RF antennas over an ultra-wide bandwidth require high rate analog-to-digital converters (ADC). Such high-rate ADC's are expensive and power hungry, and due to fundamental physical limits (such as the Walden curve (See the List of Incorporated Literature References, Literature Reference No. 9)) are not capable of achieving the sampling rate needed to capture the ultra-wide bandwidth. To mitigate this, state of the art electronic support measure (ESM) systems either use spectrum sweeping (which is too slow to handle agile emitters) or a suite of digital channelizers, which have large size, weight, and power requirements. In addition, the detection, localization, and classification algorithm ESM systems use are typically based on the fast Fourier transform, with high computational complexity and memory requirements that make it difficult to operate them in real-time over an ultra-wide bandwidth.

Further, mixed signals are typically noisy, making them difficult to separate. Conventional methods for denoising signals fall into two categories: filter-based methods, and training-based approached. Filter-based methods use filtering to smooth out noise from a signal, but are too simplistic to simultaneously maintain the low-frequency long-term trends of a signal while adapting to the high-frequency abrupt transitions. Training-based methods rely on a "dictionary" that models the signals of interest. Such a dictionary must be trained in an offline process, and requires training data that may not be available. In addition, the dictionary often requires a large amount of memory and computation to be stored and leverage on the platform, making such approaches infeasible for ultra-low size-, weight-, and power (SWaP) systems.

Conventional methods for BSS typically require a greater number of input mixtures (which maps directly to a greater number of antennas) than the number of source signals, limiting their applicability in SWaP-constrained scenarios (see Literature Reference No. 1). Some extensions to conventional BSS have addressed the "underdetermined" scenario (with fewer mixtures than sources) that leverage prior knowledge about the sources, such as having "low complexity" or having a sparse representation with respect to a learned dictionary. Such models of prior knowledge are too broad, enabling the system to overfit an entire mixture as a single source, and require large amounts of memory to store the dictionary and computation to recover the presentation of the input mixtures with respect to the dictionary (see Literature Reference Nos. 1 and 3). In Literature Reference No. 3, the authors coupled the BSS algorithm with an IIR bandpass filter with tunable center frequency in order to separate temporally correlated sources. This work is still quite limited, requiring at least as many mixtures as sources, requiring that the mixtures be "prewhitened" to have an identity-valued covariance matrix, and using the second-order statistics of sources as the sole cue for separation.

Thus, a continuing need exists for a system that reduces the computation and hardware complexity needed to implement filtering, filter adaptation, and/or signal tracking and, in doing so, allow for the system to be developed on low-power hardware, including finite programmable gate arrays (FPGAs) and custom digital application-specific integrated circuits (ASICs).

SUMMARY OF INVENTION

The present disclosure provides a cognitive signal processor for signal denoising and blind source separation. In various embodiments, the cognitive signal processor comprises one or more processors and a memory. The memory, is, for example, a non-transitory computer-readable medium having executable instructions encoded thereon, such that upon execution of the instructions, the one or more processors perform several operations. In other aspects, the one or more processors are hardwired or otherwise configured to perform the operations herein. For example, during operation, the cognitive signal processor receives a mixture signal that comprises a plurality of source signals. A denoised reservoir state signal is generated by mapping the mixture signal to a dynamic reservoir to perform signal denoising. Finally, at least one separated source signal is identified by adaptively filtering the denoised reservoir state signal.

In another aspect, filtering the denoised reservoir state signal is performed with a bank of filters.

In another aspect, the system performs an operation of controlling the bank of filters to cause each filter within the bank of filters to filter a unique waveform.

Further, each filter has an adaptable center frequency.

In another aspect, adaptively filtering the denoised reservoir state signal further comprises operations of: detecting that a particular frequency band possesses a pulse; switching a first filter to a tracking state with a center frequency equal to a resonant frequency of a reservoir state corresponding to the particular frequency band; and setting the center frequency of the first filter as a protected region to prevent other filters within a bank of filters from sharing the center frequency.

In yet another aspect, adaptively filtering the denoised reservoir state signal further comprises operations of: switching the first filter to a holding state if the first filter loses the pulse of the particular frequency band; maintaining the first filter in the holding state for a fixed period of time while maintaining the protected region; and if during the fixed period of time the pulse returns, switching the first filter to the tracking state, otherwise switching the first filter to an inactive state and removing the protected region.

In another aspect, generating the denoised reservoir state signal further comprises delay embedding the reservoir state signal to generate a reservoir state history.

Additionally, generating the denoised reservoir state signal further comprises generating a predicted input signal a small-time step ahead of the mixture signal, wherein an error between the predicted input signal and mixture signal is used to update output weights of the dynamic reservoir.

In another aspect, generating the denoised reservoir state signal is performed with a dynamic reservoir implemented in analog hardware by satisfying a set of ordinary differential equations.

Further, generating the denoised reservoir state signal is performed with a dynamic reservoir implemented in software or digital hardware by converting a set of ordinary differential equations to delay difference equations.

Finally, the present invention also includes a computer program product and a computer implemented method. The computer program product includes computer-readable instructions stored on a non-transitory computer-readable medium that are executable by a computer having one or more processors, such that upon execution of the instructions, the one or more processors perform the operations listed herein. Alternatively, the computer implemented method includes an act of causing a computer to execute such instructions and perform the resulting operations.

BRIEF DESCRIPTION OF THE DRAWINGS

The objects, features and advantages of the present invention will be apparent from the following detailed descriptions of the various aspects of the invention in conjunction with reference to the following drawings, where.

DETAILED DESCRIPTION

Figure 1A:
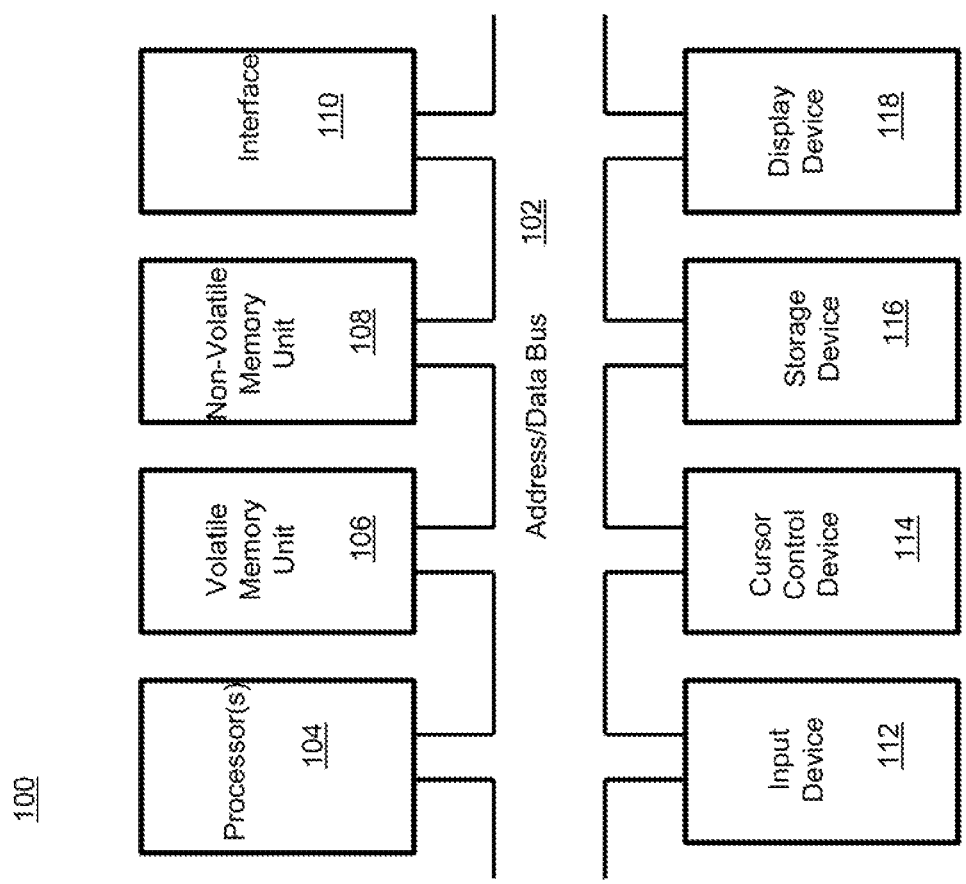
FIG. 1A is a block diagram depicting the components of a system according to various embodiments of the present invention.

The present invention relates to blind source separator and, more specifically, to signal processor that denoises a mixed input signal and performs blind source separation on the input signal to extract and separate the signals. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of aspects. Thus, the present invention is not intended to be limited to the aspects presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Before describing the invention in detail, first a list of cited references is provided. Next a description of the various principal aspects of the present invention is provided. Subsequently, an introduction provides the reader with a general understanding of the present invention. Finally, specific details of various embodiment of the present invention are provided to give an understanding of the specific aspects.

(1) List of Incorporated Literature References

The following references are cited throughout this application. For clarity and convenience, the references are listed herein as a central resource for the reader. The following references are hereby incorporated by reference as though fully set forth herein. The references are cited in the application by referring to the corresponding literature reference number, as follows:

1. S. Choi, A. Cichocki, H.-M. Park, and S.-Y, Lee, "Blind Source Separation and Independent Component Analysis: A. Review," Neural Information Processing—Letters, Vol. 6, No. 1, January 2005.
2. A. Cichocki and A. Belouchrani, "Sources separation of temporally correlated sources from noisy data using a bank of band-pass filters," in Proc. of Independent Component Analysis and Signal Separation (ICA-2001), pp. 173-178, San Diego, USA, December 9-13, 2001.
3. A. Hyvarinen, "Complexity Pursuit: Separating Interesting Components from Time Series," Neural Computation, Vol. 13, No. 4, pp. 883-898, April 2001.
4. IgeL C. and Husken, M., "Improving the Rprop learning algorithm", in Proc. of the $2^{nd}$ Int. Symposium on Neural Computation. (NC'2000), pp. 115-121, ICSC Academic Press, 2000.
5. R. Legenstein, et al. "Edge of Chaos and Prediction of Computational Performance for Neural Microcircuit Models," Neural Networks, 20(3), 2007.
6. W. Maass, "Liquid Computing", Proc. of the Conference CiE'07: COMPUTABILITY IN EUROPE 2007, Siena (Italy)
7. F. Takens, "Detecting Strange Attractors in Turbulence," Dynamical Systems and Turbulence, Lecture Notes in Mathematics Vol. 898, 1981.
8. D. Verstraeten, et al. "An experimental unification of reservoir computing methods", Neural Networks, vol. 20, no. 3, April 2007.
9. R. H. Walden, "Analog-to-digital converter survey and analysis," IEEE J. Sel. Areas Commun., vol. 51, pp. 539-548, 1999.
10. H. Yap, et al., "A First Analysis of the Stability of Takens' Embedding" in Proc. of the IEEE Global Conference on Signal and Information Processing (GlobalSIP) symposium on Information Processing for Big Data, December 2014.

(2) Principal Aspects

Various embodiments of the invention include three "principal" aspects. The first is a system for signal processing (i.e., signal processor). The system is typically in the form of a computer system operating software or in the form of a "hard-coded" instruction set. This system may be incorporated into a wide variety of devices that provide different functionalities. The second principal aspect is a method, typically in the form of software, operated using a data processing system (computer). The third principal aspect is a computer program product. The computer program product generally represents computer-readable instructions stored on a non-transitory computer-readable medium such as an optical storage device, e.g., a compact disc (CD) or digital versatile disc (DVD), or a magnetic storage device such as a floppy disk or magnetic tape. Other, non-limiting examples of computer-readable media include hard disks, read-only memory (ROM), and flash-type memories. These aspects will be described in more detail below.

A block diagram depicting an example of a system (i.e., computer system 100) of the present invention is provided in FIG. 1A. The computer system 100 is configured to perform calculations, processes, operations, and/or functions associated with a program or algorithm. In one aspect, certain processes and steps discussed herein are realized as a series of instructions (e.g., software program) that reside within computer readable memory units and are executed by one or more processors of the computer system 100. When executed, the instructions cause the computer system 100 to perform specific actions and exhibit specific behavior, such as described herein. For example, in various embodiments, the system includes one or more processors configured to perform the various operations described herein. In one aspect, the system includes one or more processors and a memory, the memory being a non-transitory computer-readable medium having executable instructions encoded thereon, such that upon execution of the instructions, the one or more perform the operations. In other aspects, the processors are hardwired to perform the opertions. Thus, the system 100 may be configured to perform operations by executing instructions from a computer memory or by being hardwired to perform certain tasks.

The computer system 100 may include an address/data bus 102 that is configured to communicate information. Additionally, one or more data processing units, such as a processor 104 (or processors), are coupled with the address/data bus 102. The processor 104 is configured to process information and instructions. In various aspects, the processor 104 (or processors) include one or more of a microprocessor, a parallel processor, an application-specific integrated circuit (ASIC), a digital ASIC, a programmable logic array (PLA), complex programmable logic device (CPLD), and a field programmable gate array (FPGA).

The computer system 100 is configured to utilize one or more data storage units. The computer system 100 may include a volatile memory unit 106 (e.g., random access memory ("RAM"), static RAM, dynamic RAM, etc.) coupled with the address/data bus 102, wherein a volatile memory unit 106 is configured to store information and instructions for the processor 104. The computer system 100 further may include a non-volatile memory unit 108 (e.g., read-only memory ("ROM"), programmable ROM ("PROM"), erasable programmable ROM ("EPROM"), electrically erasable programmable ROM "EEPROM"), flash memory, etc.) coupled with the address/data bus 102, wherein the non-volatile memory unit 108 is configured to store static information and instructions for the processor 104. Alternatively, the computer system 100 may execute instructions retrieved from an online data storage unit such as in "Cloud" computing. In an aspect, the computer system 100 also may include one or more interfaces, such as an interface 110, coupled with the address/data bus 102. The one or more interfaces are configured to enable the computer system 100 to interface with other electronic devices and computer systems. The communication interfaces implemented by the one or more interfaces may include wireline (e.g., serial cables, modems, network adaptors, etc.) and/or wireless (e.g., wireless modems, wireless network adaptors, etc.) communication technology.

In one aspect, the computer system 100 may include an input device 112 coupled with the address/data bus 102, wherein the input device 112 is configured to communicate information and command selections to the processor 100. In accordance with one aspect, the input device 112 is an alphanumeric input device, such as a keyboard, that may include alphanumeric and/or function keys. Alternatively, the input device 112 may be an input device other than an alphanumeric input device. In an aspect, the computer system 100 may include a cursor control device 114 coupled with the address/data bus 102, wherein the cursor control device 114 is configured to communicate user input information and/or command selections to the processor 100. In an aspect, the cursor control device 114 is implemented using a device such as a mouse, a track-ball, a track-pad, an optical tracking device, or a touch screen. The foregoing notwithstanding, in an aspect, the cursor control device 114 is directed and/or activated via input from the input device 112, such as in response to the use of special keys and key sequence commands associated with the input device 112. In an alternative aspect, the cursor control device 114 is configured to be directed or guided by voice commands.

In an aspect, the computer system 100 further may include one or more optional computer usable data storage devices, such as a storage device 116, coupled with the address/data bus 102. The storage device 116 is configured to store information and/or computer executable instructions. In one aspect, the storage device 116 is a storage device such as a magnetic or optical disk drive (e.g., hard disk drive ("HDD"), floppy diskette, compact disk read only memory ("CD-ROM"), digital versatile disk ("DVD")). Pursuant to one aspect, a display device 118 is coupled with the address/data bus 102 or any other suitable location or component of the system 100, wherein the display device 118 is configured to display video and/or graphics. In an aspect, the display device 118 may include a cathode ray tube ("CRT"), liquid crystal display ("LCD"), field emission display ("FED"), plasma display, light emitting diode ("LED") or any other display device suitable for displaying video and/or graphic images and alphanumeric characters recognizable to a user.

The computer system 100 presented herein is an example computing environment in accordance with an aspect. However, the non-limiting example of the computer system 100 is not strictly limited to being a computer system. For example, an aspect provides that the computer system 100 represents a type of data processing analysis that may be used in accordance with various aspects described herein. Moreover, other computing systems may also be implemented. Indeed, the spirit and scope of the present technology is not limited to any single data processing environment. Thus, in an aspect, one or more operations of various aspects of the present technology are controlled or implemented using computer-executable instructions, such as program modules, being executed by a computer. In one implementation, such program modules include routines, programs, objects, components and/or data structures that are configured to perform particular tasks or implement particular abstract data types. In addition, an aspect provides that one or more aspects of the present technology are implemented by utilizing one or more distributed computing environments, such as where tasks are performed by remote processing devices that are linked through a communications network, or such as where various program modules are located in both local and remote computer-storage media including memory-storage devices.

Figure 2:
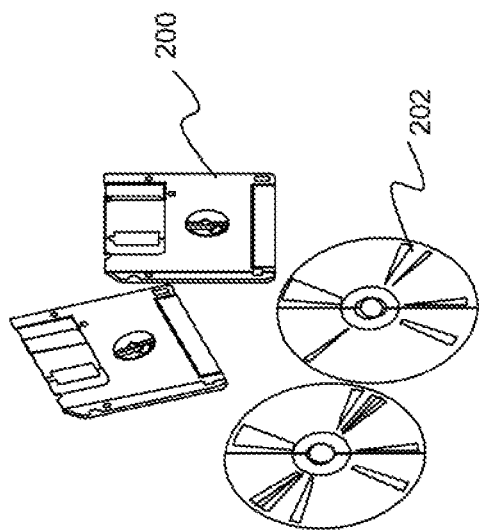
FIG. 2 is an illustration of a computer program product embodying an aspect of the present invention.

An illustrative diagram of a computer program product (i.e., storage device) embodying the present invention is depicted in FIG. 2. The computer program product is depicted as floppy disk 200 or an optical disk 202 such as a CD or DVD. However, as mentioned previously, the computer program product generally represents computer-readable instructions stored on any compatible non-transitory computer-readable medium. The term "instructions" as used with respect to this invention generally indicates a set of operations to be performed on a computer, and may represent pieces of a whole program or individual, separable, software modules. Non-limiting examples of "instruction" include computer program code (source or object code) and "hard-coded" electronics (i.e. computer operations coded into a computer chip). The "instruction" is stored on any non-transitory computer-readable medium, such as in the memory of a computer or on a floppy disk, a CD-ROM, and a flash drive. In either event, the instructions are encoded on a non-transitory computer-readable medium.

(3) Introduction

This disclosure provides a system for signal processing (or otherwise referred to as a "cognitive" signal processor (CSP)) that takes an input signal containing a mixture of pulse waveforms over a very large (e.g., >30 Ghz) bandwidth and simultaneously denoises the input signal and performs blind source separation (BSS) on the input signal. By denoising and performing BSS on the input signal, the system effectively extracts and separates the individual pulse waveforms from the mixture.

Some embodiments of the CSP incorporate one or more of the following features. First, the system may use a bank of Finite Impulse Response (FIR) filters constructed by applying tunable mixing weights to the state output of a dynamic reservoir. Second the mixing weights (and consequently frequency response) for each filter may be adapted using a novel gradient descent procedure that is described in further detail below. Third, the filters may be activated and initialized by using the reservoir state output to determine when a source signal is present near a given frequency band. The adaptation scheme employed by the system may incorporate an explicit mechanism that limits how close different filters can approach one another in the frequency domain, which is used to ensure that each filter extracts a unique signal. Fourth, the system may incorporate a dynamic phenomenon that is analogous to momentum and allows filters to track signals through repeated collision with other signals in the time-frequency domain.

Various embodiments of the system described herein may possess several advantages/improvements over state-of-the art methods in challenging denoising or BSS scenarios. Such advantages/improvements include one or more of the following:

1. For some embodiments, because the CSP performs adaptive filtering, its hardware-based embodiment may have much less weight and power than current brute-force channelization methods.
2. For some embodiments, by employing the reservoir states as a cueing mechanism, the CSP can detect and track many pulse waveforms over an ultra-wide bandwidth of over 30 Ghz employing very narrow bandwidth filters with high frequency resolution, and yet still exhibit very low signal detection latencies on the order of 0.1 nanoseconds.
3. For some embodiments, the system is capable of denoising signals in real-time using a constraint that covers a wide range of electromagnetic and acoustic signals of interest. Many other current approaches use powerful but computationally expensive constraints, such as signal complexity measures, or rely on loose constraints, such as filter banks, which may be less computationally expensive but have limited capacity to capture the structure of real-world source signals. In contrast, the system improves upon the prior art by utilizing the constraint that the waveforms of interest in a source signal can be linearly predicted over a short interval of time, which can be computed quickly with limited computational cost.
4. For some embodiments, in the deterministically designed reservoir, the reservoir states each correspond to the amount of input signal energy near a particular frequency. This allows the CSP to generate a real-time spectrogram of a complex input signal that can be implemented efficiently in hardware.
5. For some embodiments, the CSP can simultaneously extract large numbers of noisy source signals that have been linearly mixed by a single antenna. That is, in order to be effective the CSP does not require a multi-antenna array or a large bank of fixed pre-defined filters, which is needed by many other methods for BSS.
6. For some embodiments, due to incorporation of state-dependent filter behavior, the system is able to track source signals continuously, even if the signal is momentarily lost, as well as reducing the incidence of false alarms. Furthermore, each filter extracts a unique source single, thus avoiding the extraction of confounding and unnecessary duplicates.
7. For some embodiments, due to a unique Momentum component, which has low memory and computational requirements, the filters are able to track multiple signals through repeated collisions in the time-frequency domain. This is a scenario that very few state-of-the-art blind source separation methods can handle.

Figure 1B:
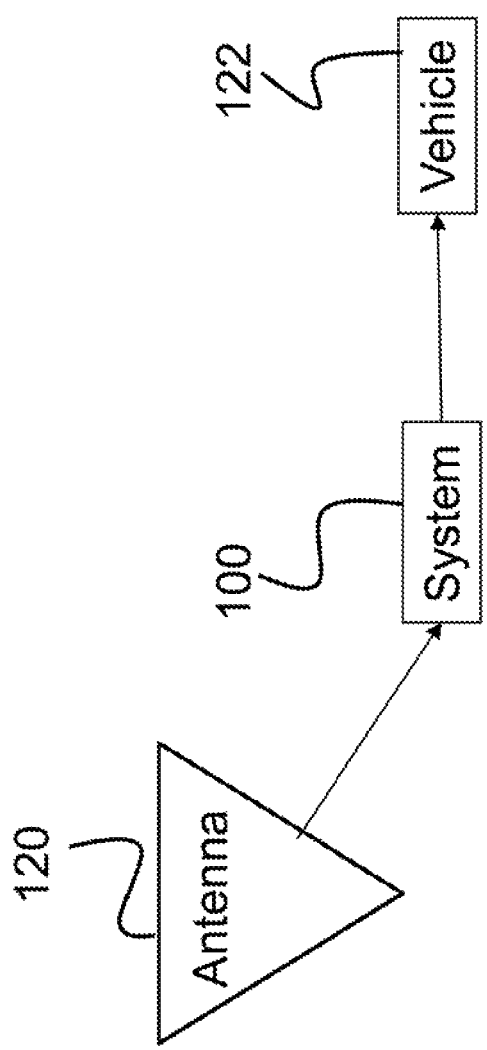
FIG. 1B is a block diagram depicting the a system according to various embodiments of the present invention.

As can be appreciated by those skilled in the art, the system described herein has several applications. For example, the system can be used with Electronic Support Measures (ESM) receivers developed by Argon ST and with other systems on airborne platforms. The system is also applicable to vehicle (e.g., UAV, plane, car, boat, robot) or man-portable applications, such as rapid detection and separation of significant objects (e.g., obstacles, terrain, other vehicles, persons, animals) from clutter from radar antenna signals. In autonomous vehicle operation, cars or other vehicles may use radars to detect and avoid obstacles. Due to clutter, such as trees, other cars, and walls, the radar returns for obstacles may be weak relative to other returns within the spectrum and also obscured by them. In one aspect and as shown in FIG. 1B, the system 100 described herein simultaneously de-noises radio frequency (RF) signals, such as those collected by radar receivers 120 (e.g. antenna, sensors, etc.), and boosts detection of weak returns that could correspond to significant objects, while also separating out all narrowband (tone-line) pulses corresponding to different objects in the scene. Separation of significant object pulses from clutter pulses reduces the likelihood that the autonomous vehicle will be confused by clutter and can then effectively detect and avoid a significant object. For example, once a significant object is detected, the system 100 can cause a vehicle 122 to act (by being connected to an interfacing with an appropriate vehicle control system) based on the significant object, such as slowing, accelerating, stopping, turning, and/or otherwise maneuvering around the significant object. Other actions based on the obstacle are also possible, such as causing the vehicle 122 to inform or warn a vehicle occupant and/or vehicle operator about the obstacle with an audible warning, a light, text, and/or an image, such as a radar display image. For further examples, the system 100 may generate commands and control operations of vehicle systems that can be adjusted, such as vehicle suspension or safety systems such as airbags and seatbelts, etc.

(4) Specific Details of Various Embodiments

Figure 3:
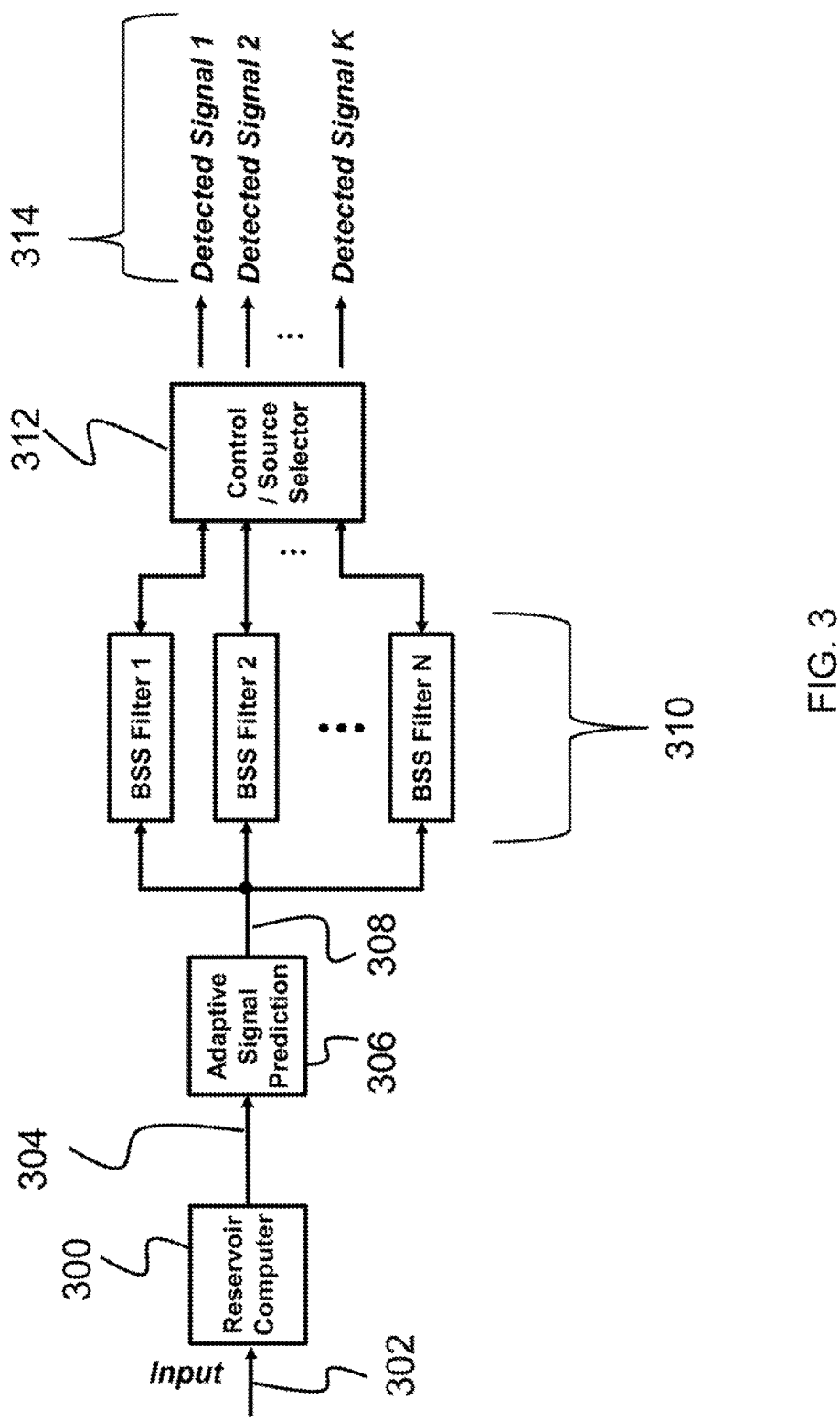
FIG. 3 is an illustration depicting system architecture for a cognitive signal processor according to various embodiments of the present invention.
Figure 6:
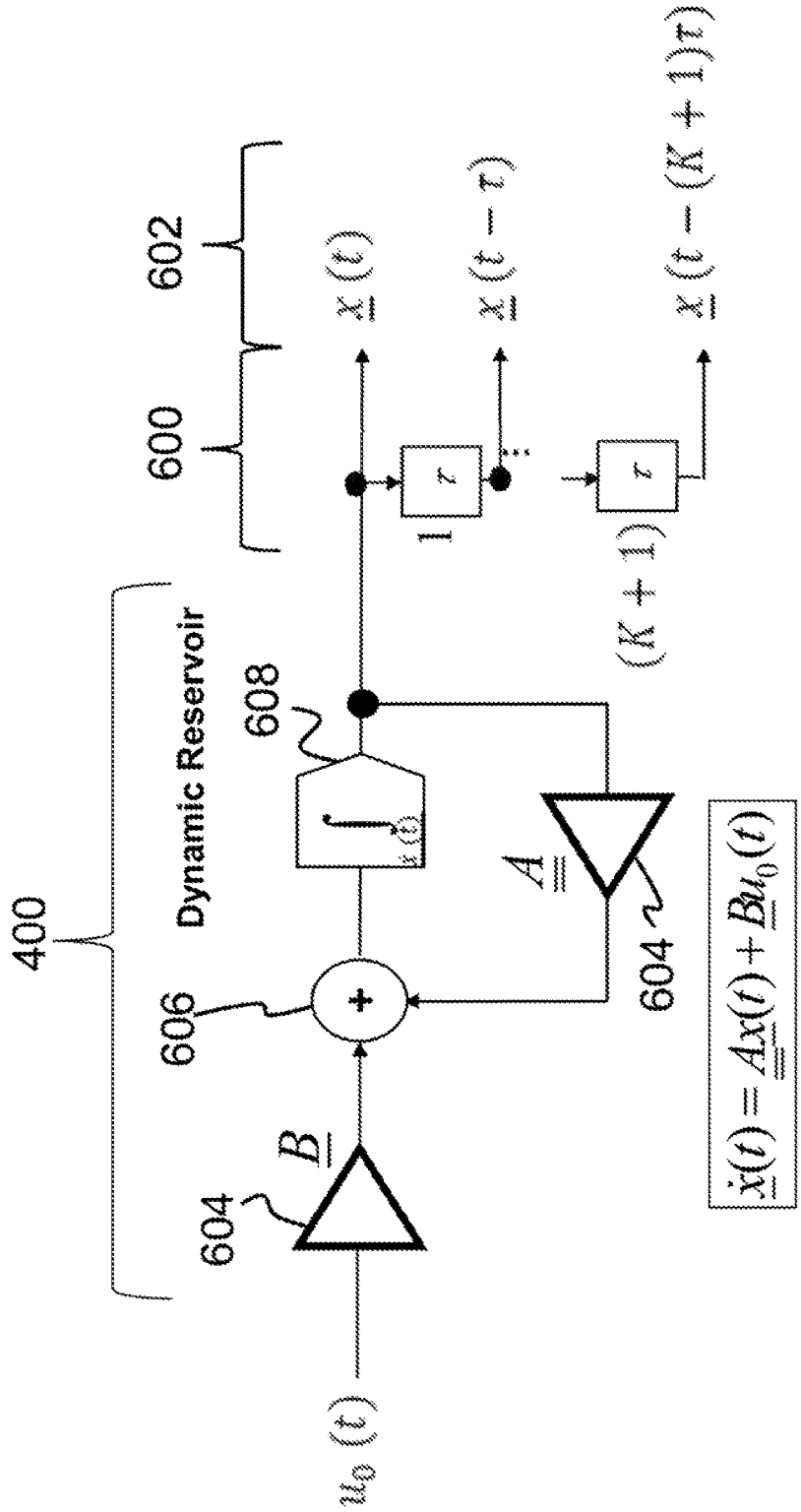
FIG. 6 is an illustration depicting a dynamic reservoir that applies a delay embedding to the reservoir states to provide a time history of reservoir dynamics.

As noted above, this disclosure provides a system for signal processing (or "cognitive" signal processor (CSP)) that denoises a mixed input signal and performs blind source separation on the input signal to extract and separate the signals. The architecture for the CSP is shown in FIG. 3. As shown, the first component is a dynamic reservoir computer (RC) 300, which is the "neuromorphic" (brain-inspired) aspect of the system. The reservoir computer 300 accepts the mixture signals 302 as input and maps it to a high-dimensional dynamical system known as the dynamic reservoir. The RC 300 has a predefined number of outputs, which are generated by continually mapping the reservoir states through a set of distinct linear functions with one such function defined per output. The CSP uses a "dynamic" reservoir computer because the reservoir state signals are continuously passed through a delay embedding, which creates a finite temporal record of the values of the reservoir state (i.e., reservoir state history 304). The reservoir state history 304 of the dynamic reservoir in FIG. 3 corresponds to element 602 as depicted in FIG. 6. That is, given a reservoir state x(t), history length K+1, and delay width τ, the reservoir state history 304 is the collection(x(t), x(t−τ), . . . , x(t−(K+1)τ). This delay embedding, when combined with the optimized reservoir design, enables the CSP to perform signal prediction and denoising on both the original input signal and the individual reservoir states.

The second component is a adaptive signal prediction module 306 that use gradient descent-based short time prediction to adapt the output (i.e., reservoir state history 304) of the reservoir to produce a prediction of the input signal 302 a small time-step in the future. Since the noise in the input signal 302 is inherently random and unpredictable, the predicted input signal will be free of noise. The error between the predicted input signal and actual input signal is used by the adaptive signal prediction module to further tune the output weights of the reservoir in an iterative process to generate denoised reservoir states 308.

The third component of the CSP is a bank of adaptable Blind Source Separation (BSS) filters 310 that separate out and track pulses from the input signal 302 mixture. This component is a key aspect of the system. Unlike previous BSS systems that use a bank of adaptable filters, the system described herein implements the filters as linear combinations of the reservoir states. This is much more efficient to implement in hardware than implementing standalone FIR or IIR filters. Each of the BSS filters in the bank of filters 310 is activated by a filter controller that measures the reservoir state energy to detect the presence of a signal in a particular band. The BSS filters 310 also include mechanisms for modifying center frequencies in order to track pulses. Each BSS filter 310 includes a filter adapter that updates the center frequencies of the particular filter based on the error function and the filter states. The frequency update is depicted as element 804 in FIG. 8.

The fourth component is a control/source selector 312 that ensures that each BSS filter 310 tracks a unique pulse. The control/source selector 312 accepts the filter 310 outputs as input and is responsible for controlling which filters are actively tracking pulse waveforms, resulting in original denoised pulse waveforms (i.e., detected signals 314) that represent a final output of the system.

(4.1) Reservoir Computing

Figure 4:
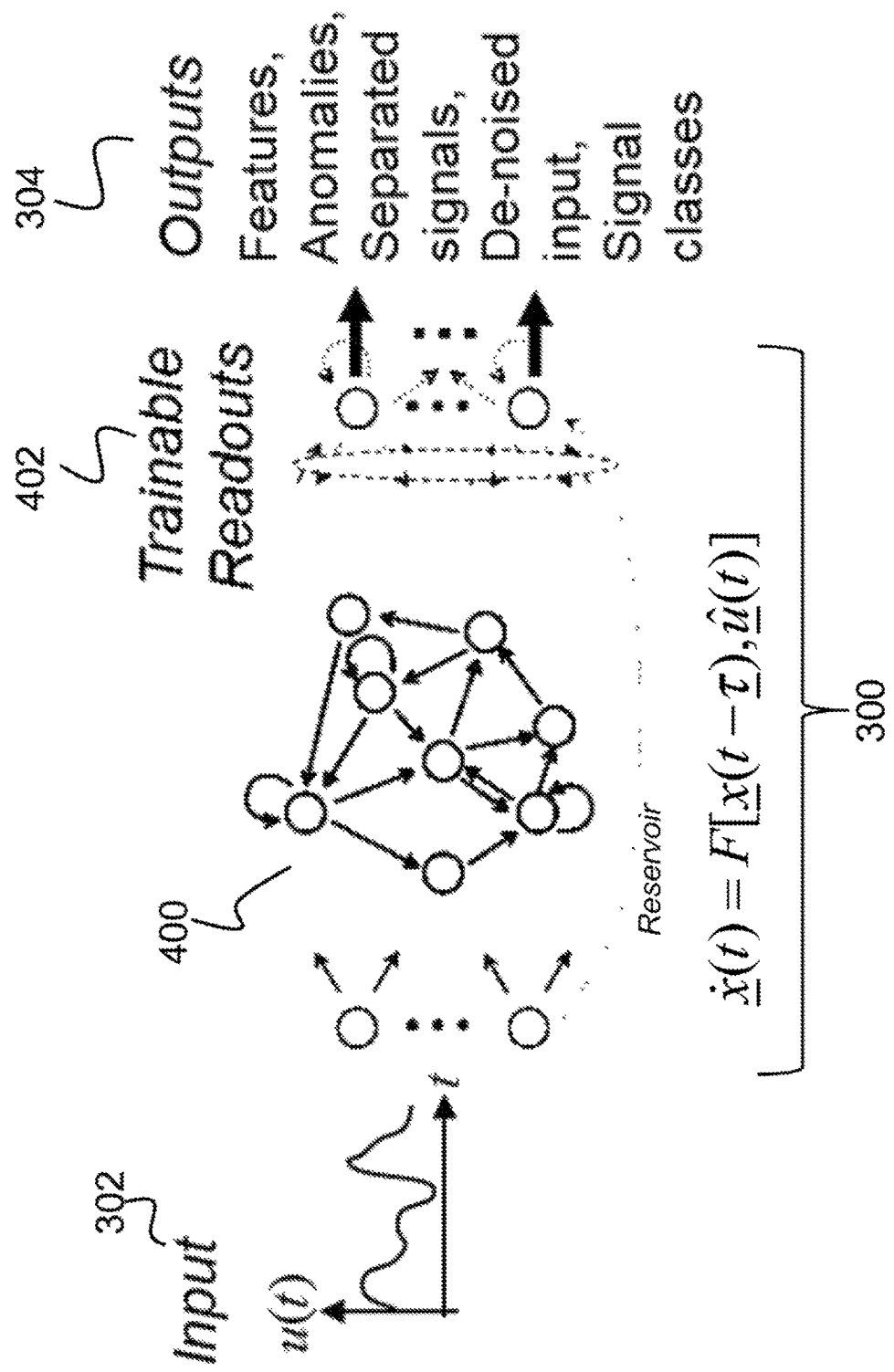
FIG. 4 is an illustration depicting reservoir computer mapping of an input signal vector to a high-dimensional state-space that models underlying time-varying dynamics of the signal generation process.

The CSP is based on a form of neuromorphic (brain-inspired) signal processing known as reservoir computing (RC) (see Literature Reference Nos. 5, 6, and 8 for a description of reservoir computing). As seen in FIG. 4, a reservoir computer 300 is a special form of a recurrent neural network (a neural network with feedback connections) that operates by projecting the input signal vector 302 into a high-dimensional reservoir 400 state space which contains an equivalent dynamical model of the signal generation process capturing all of the available and actionable information about the input 302. A reservoir 400 has readout layers that can be trained, either off-line or on-line, to learn desired outputs by utilizing the state functions. Thus, an RC 300 has the power of recurrent neural networks to model non-stationary (time-varying) processes and phenomena, but with simple readout layers and training algorithms that are both accurate and efficient. The reservoir states can be mapped to useful outputs 304, including denoted inputs, signal classes, separated signals, and anomalies using trainable linear readout layers 402.

There is a strong connection between reservoir computing and state-space filtering. Conventional RF/microwave filters typically implement the Laplace domain filtering algorithm:

$$s\underline{x}(s) = \underline{A}\underline{x}(s) + \underline{B}u(s)$$

$$y(s) = \underline{C}^T \underline{x}(s) + Du(s)$$

where $\underline{x}(s)$, $u(s)$, and $y(s)$ are the state-space representations of the reservoir state, input signal, and output, respectively.

Figure 5:
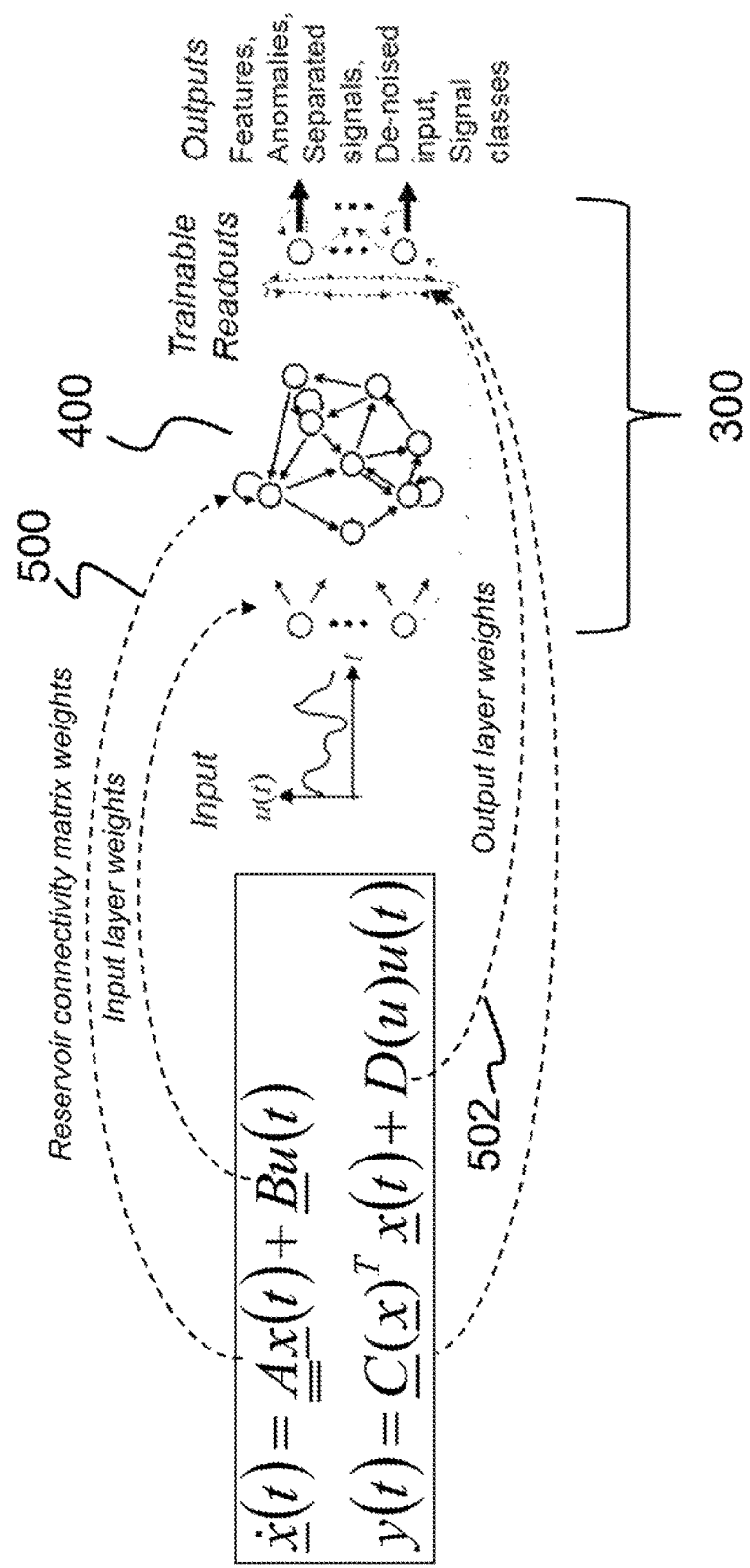
FIG. 5 is an illustration depicting a correspondence between state-space representation components and parameters in the reservoir computer.

A state space filter implements a time-domain filtering algorithm, and as seen in FIG. 5, the different components of the reservoir 400 state-space representation have a direct correspondence with different parameters in the reservoir computer 300. In particular, the reservoir connectivity matrix weight ($\underline{A}$) 500 determines the filter pole locations. Similarly, the output layer weights ($\underline{C}$) 502 determine the filter zero locations. As the output layer weights 502 are adaptable, the reservoir computer 300 can implement an adaptable (nonlinear) state-space filter.

(4.2) Optimized Reservoir Design for Signal Denoising and Blind Source Separation In conventional reservoir computers, the weights in both the reservoir connectivity matrix ($\underline{A}$) and the input-to-reservoir mapping matrix ($\underline{B}$) are typically chosen randomly. As a nonlimiting example, the entries of $\underline{A}$ and $\underline{B}$ can be independent, identically distributed samples from a zero-mean, unit variance Gaussian distribution. Such random reservoir weight matrices have been successfully used in many previous applications, such as pattern recognition. However, in these kinds of reservoirs, the individual values of the reservoir states are meaningless in isolation, and can only be used for an application when combined together via learned mixing weights. In addition, to implement such a reservoir in low-power hardware (e.g., an FPGA or digital ASIC), the reservoir state update require computation proportional to the square of the number of nodes, which become infeasible as the number of reservoir nodes increase.

Described below is a method for optimizing the reservoir weight matrix ($\underline{A}$) for the tasks of signal denoising and blind source separation. For signal denoising, the designed reservoir states are better able to predict the input signal, resulting in increased SNR of the denoised signal. For blind source separation, each reservoir state in our optimized reservoir measures the amount of signal energy near a particular resonant frequency, which can be used a cueing mechanism to make the BSS subsystem start tracking a pulse near the given frequency. In addition, the BSS subsystem can use the designed reservoir states as a basis with which to construct a bank of adaptable FIR filters to track individual narrow-band pulses within the input signal mixture. Finally, the computation of the designed reservoir state scales linearly with the number of nodes, thus enabling efficient implementation in low-power hardware.

To mathematically derive the RC output layer iteration adaptations that are used to implement the optimized denoising algorithm, the linear state space described by the equations in FIG. 4 is used. For A and B independent of the input and state space vector, the formal solution of the state equation is given as follows:

$$x(t) = e^{At}[x(0) + \int_0^t ds \, e^{-As}Bu(s)],$$

which can be verified by time-differentiating both sides of the equation. Here, $e^{At}$ is a matrix exponential and the time integral is over a matrix quantity. An important point to note is that the initial time in the formal solution is arbitrary (up to causality, of course); thus, for any $\tau > 0$:

$$x(t_i + \tau) = e^{A\tau}[x(t_i) + \int_{t_i}^{t_i+\tau} ds \, e^{-As}Bu(s)].$$

Given the state space vector at some time $t_i$, along with the system parameters A and B and input signal $u(t_i + \Delta t)$ over the interval of interest $0 \geq \Delta t \geq \tau$, the system can compute all future values of the state space vector at $t + \Delta t$. This form naturally lends itself to parallel computation in a discretized form, and is the basis for the optimized signal prediction and denoising algorithm.

Several observations can be made about the linear state space system that enable significant simplifications in the implementation of the algorithm. As stated earlier, the matrix A must be real; additionally, when describing a passive IIR filter, the matrix A has eigenvalues (poles of the filter) that are either purely real and negative corresponding to purely damped modes, or eigenvalues that come in complex conjugate pairs, with negative real parts to tire eigenvalues. This observation allows the matrix A to be put into a purely real block-diagonal form with a real block-diagonalizing similarity transform. The block-diagonalized matrix $SAS^{-1}$ has the form;

$$SAS^{-1} = \begin{pmatrix} \lambda_{r,1} & \lambda_{i,1} & 0 & 0 & 0 & \cdots & 0 & 0 \\ -\lambda_{i,1} & \lambda_{r,1} & 0 & 0 & 0 & \cdots & 0 & 0 \\ 0 & 0 & \lambda_{r,2} & \lambda_{i,2} & 0 & \cdots & 0 & 0 \\ 0 & 0 & -\lambda_{i,2} & \lambda_{r,2} & 0 & \cdots & 0 & 0 \\ 0 & 0 & 0 & 0 & \ddots & \ddots & \vdots & \vdots \\ \vdots & \vdots & \vdots & \vdots & \ddots & \ddots & 0 & 0 \\ 0 & 0 & 0 & 0 & \cdots & 0 & \lambda_{r,n} & \lambda_{i,n} \\ 0 & 0 & 0 & 0 & \cdots & 0 & -\lambda_{i,n} & \lambda_{r,n} \end{pmatrix}$$

Here n is the number of complex conjugate poles, with N=2n; including purely damped poles as well as introducing purely diagonal eigenvalues into the canonical form (for some applications, system matrices A with only complex conjugate pair poles are used). Because any state space system can be converted to a system with block diagonal A by similarity transforms on x(t), B, and C, it is assumed in the following that A is block diagonal Described below is the state space system in the Laplace domain. The block diagonal form provides the following:

$$\hat{y}(s) = \sum_{j=1}^{n} \frac{(B_{2j-1}C_{2j-1} + B_{2j}C_{2j})(s - \lambda_{r,j}) + \lambda_{i,j}(B_{2j-1}C_{2j} - B_{2j}C_{2j-1})}{\lambda_{i,j}^2 + (s - \lambda_{r,j})^2} \hat{u}(s) + D\hat{u}(s)$$

where overhats denote Laplace domain quantities. Notice that the combination of B and C entries in the numerator in the sum contribute to only two independent quantities for each j. For each block-diagonal subspace, or equivalently, each oscillator, the contribution to the response has four independent degrees of freedom (two components each of B and C) and two constraints. This allows the system to fix all components of B to be 1, and control the transfer function with only modifications to C.

For denoising applications, the denoised signal can be reconstructed using the response of the state system to delayed copies of the input signal u(t). Following the analysis of the previous paragraph, all delays on the input signal u(t) can be converted to delays on the state space vector x(t). With $N_d$ delays on the input signal, with basic delay $\tau$, the Laplace domain response is $$\hat{y}(s) = \sum_{j=1}^{n} \sum_{m=0}^{N_d - 1} \frac{(B_{2j-1}^{(m)}C_{2j-1} + B_{2j}^{(m)}C_{2j})(s - \lambda_{r,j}) + \lambda_{i,j}(B_{2j-1}^{(m)}C_{2j} - B_{2j}^{(m)}C_{2j-1})}{\lambda_{i,j}^2 + (s - \lambda_{r,j})^2} e^{-smr}\hat{u}(s) + D\hat{u}(s).$$

On the other hand, a system with $N_d$ delays on the state space vector has Laplace domain response as follows:

$$\hat{y}(s) = \sum_{j=1}^{n} \sum_{m=0}^{N_d - 1} \frac{(B_{2j-1}C_{2j-1}^{(m)} + B_{2j}C_{2j}^{(m)})(s - \lambda_{r,j}) + \lambda_{i,j}(B_{2j-1}C_{2j}^{(m)} - B_{2j}C_{2j-1}^{(m)})}{\lambda_{i,j}^2 + (s - \lambda_{r,j})^2} e^{-smr}\hat{u}(s) + D\hat{u}(s).$$

The state space delayed response can be made exactly the same as the input signal delayed response by the following identifications: $B_{2j-1} = C_{2j}$, $B_{2j} = C_{2j-1}$, $C_{2j}^{(m)} = B_{2j}^{(m)}$, $C_{2j-1}^{(m)} = B_{2j}^{(m)}$. In the following it is assumed that all delays in the system are to the state space vector x(t).

Implementation of the state space system on low-power hardware such as FPGAs may require not only discretization of the associated system equations, but proper normalization for the state space vector. Consider a single 2×2 sub-block of the block-diagonalized linear state space system. The response to a time-harmonic input signal in a 2×2 sub-block can be computed analytically, with the asymptotic response to an input signal with angular frequency ω given by $$x_{\pm,A}(\omega) = \sqrt{\frac{(\lambda_i \pm \lambda_r)^2 + \omega^2}{\lambda_i^4 + 2\lambda_i^2(\lambda_r^2 - \omega^2) + (\lambda_r^2 + \omega^2)^2}}.$$

This form assumes that the B entries for the sub-block have been set to 1, in accordance with the arguments above. The maximum response value can be determined by differentiating this expression with respect to ω, and solving for the input signal frequency giving zero derivative. Assuming that the damping is small, i.e., $\lambda_r$ is small, to lowest order the maximum response is at the resonant frequency $\omega = \lambda_i$. Thus, each state space component can be properly normalized so that its response never exceeds a given value.

(4.3) Dynamic Reservoir Using Delay Embedding of Reservoir States

This section describes how to make a "dynamic reservoir" by applying a phase delay embedding. Phase delay embedding is a technique developed in dynamical system theory to model the dynamics of a chaotic system from its observation $u_0(t)$ using delayed versions of the observation as new input vector u(t). Suppose that an unknown (potentially chaotic) dynamical system embedded in an N-dimensional state space has an m-dimensional attractor. This means that though the state space has N parameters, signals from the dynamical system form trajectories that all lie on an m-dimensional sub-manifold M of the state space, and can theoretically (though not practically) be specified by as few as m parameters. The observations (received signal) $u_0(t) = h[\underline{x}(t)]$ is a projection of the state space. The phase delay embedding produces a new input vector u(t) from n delayed versions of the observation signal $u_0(t)$ concatenated together. According to the work of Taken (see Literature Reference No. 7), given fairly broad assumptions on the curvature of the sub-manifold M and the nondegenerate nature of the projection h[·], if the number of delay coordinate dimensionality n>2m+1, then the phase delay embedding u(t) preserves the topological structure (i.e., shape) of the dynamical system, and thus can be used to reconstruct the dynamical system from observations. More recent work (see Literature Reference No. 10) shows that the delay coordinate dimensionality can be increased more (but still not a function of the ambient dimensionality N) to be able to preserve both the topology and geometry of the dynamical system, without complete knowledge of the dynamical system or the observation function.

As seen in FIG. 6, for some embodiments, a dynamic reservoir 400 is constructed by applying the delay-embedding 600 to each of the reservoir states to provide a time history 602 of reservoir dynamics. When combined with the designed reservoir states, delay-embedded states enable each state to be predicted and denoised separately, which can be used to generate a denoised spectrogram of the input signal.

In FIG. 6, everything to the left of the time history 602 is a diagrammatic instantiation of the differential equation below it: ẋ(t)=Ax(t)+Bu₀(t). The triangles 604 indicate multiplication by a scalar, vector, or matrix constraint. The plus sign 606 indicates summation of two or more signals, and the integration sign 608 indicates a running integral. The input signal u₀(t) is mapped into the reservoir by the vector B, and the change in reservoir state ẋ(t) is determined by combining Bu₀(t) with the current reservoir state x(t) scaled by the state transition matrix 4. The integtal 608 indicates that the reservoir indicates that the reservoir state is obtained by the running integral of the change in reservoir state ẋ(t).

(4.4) Adaptive Signal Prediction Using Reservoir States

This section describes the adaptive signal prediction module that uses the dynamic reservoir states in order to perform signal denoising. Given that the 1) delay embedded observations can effectively model dynamical system behavior and 2) reservoirs with delay-embedded state can be designed to have the same behavior as reservoirs with delay-embedded inputs, the system described herein leverages the time history of these reservoir state variables to perform short-term predictions of the observations. The system uses a dynamic reservoir computer to learn the prediction function F:

$$\tilde{u}_0(t+\tau) = F[u_0(t)]$$

Figure 7:
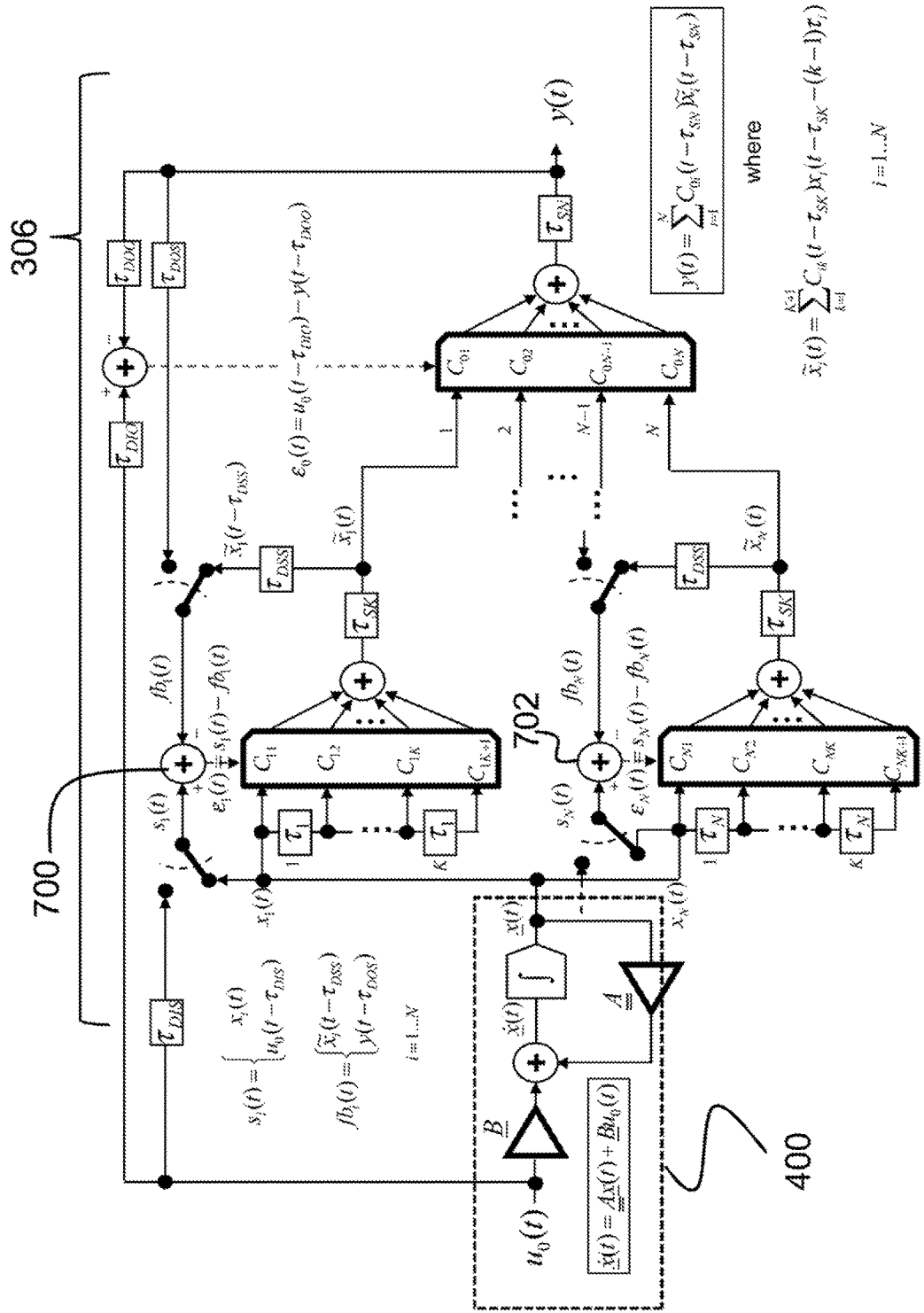
FIG. 7 is an illustration depicting a continuous time architecture for the dynamic reservoir and adaptive signal prediction modules.

For further understanding, FIG. 7 depicts a continuous time architecture of the adaptive signal prediction module 306. The model shows the dynamic reservoir 400 with fixed connections ($\underline{A}$) and adaptable output layers attached to it. A wideband ADC frontend provides input to the dynamic reservoir 400, whose output layer weights are adapted based on short-time prediction to de-noise the input signal. The weights of the output layers are adapted via the gradient learning algorithm described below. The gradient descent learning algorithm is based on short-time prediction of the input signal. Since noise is random and unpredictable, the predicted signal $y(t) \doteq \tilde{u}_0(t+\tau)$ will be free of noise.

The dynamic reservoir 400 in FIG. 6 satisfies the following set of coupled ordinary differential equations (ODE):

$$\dot{x}(t) = \underline{A}\,\underline{x}(t) + \underline{B}u_0(t)$$

$$y(t) = \sum_{k=1}^{K+1} \underline{c}_k(t)^T \underline{x}(t-(k-1)\tau) + \underline{d}(t)^T \underline{u}(t),$$

where $\underline{u}(t) \doteq [u_0(t), u_0(t-\tau), \ldots, u_0(t-K\tau)]^T$.

To perform short-time prediction of the input signal, the system uses an online gradient descent algorithm. The idea is to enforce exact or otherwise better prediction of the current time point that is used in the delay embedding. The predicted input value at time (t+τ) is calculated from the current value the of the output weights ($\underline{c}_k(t)$, $\underline{d}(t)$) and the current and past values of the states ($\underline{x}$) and the input (u). The quadratic error function to be minimized is given by:

$$E[\underline{c}_1, \ldots, \underline{c}_{K+1}, \underline{d}] \doteq [u_0(t) - \tilde{y}(t-\tau)]^2 + \lambda_c \sum_{k=1}^{K+1} \|\underline{c}_k(t)\|^2 + \lambda_d \|\underline{d}(t)\|^2,$$

where $\lambda_c$ and $\lambda_d$ are parameters that weight the importance of the output weights $\{\underline{c}_k\}_{k=1}^{K+1}$ and $\underline{d}$, and $$\tilde{y}(t-\tau) = \sum_{k=1}^{K+1} \underline{c}_k(t)^T \underline{x}(t-k\tau) + \underline{d}(t)^T \underline{u}(t-\tau).$$

Note that $\tilde{y}(t-\tau)$ is the delayed output expressed by the delayed valued of $\underline{x}$ and u and the current values of the output weights $\{\underline{c}_k\}_{k=1}^{K+1}$ and $\underline{d}$, and thus is general $\tilde{y}(t-\tau) \neq y(t-\tau)$. However, this approximation is reasonable, and allows the system to not require storage of time histories of output weights, facilitating more efficient hardware implementation.

To minimize the quadratic error $E[\underline{c}_1, \ldots, \underline{c}_{K+1}, \underline{d}]$, the gradients of $E[\underline{c}_1, \ldots, \underline{c}_{K+1}, \underline{d}]$ are computed with respect to $\{\underline{c}_k\}_{k=1}^{K+1}$ and $\underline{d}$. Based on these gradients, the weight updates to $\{\underline{c}_k(t)\}_{k=1}^{K+1}$ and $\underline{d}(t)$ satisfy the following ordinary differential equations (QDEs):

$$\dot{\underline{c}}_k(t) = -g_c \underline{c}_k(t) + \mu_c \tilde{\varepsilon}(t)\underline{x}(t-k\tau),\ k=1,2,\ldots,K+1$$

$$\dot{\underline{d}}(t) = -g_d \underline{d}(t) + \mu_d \tilde{\varepsilon}(t)\underline{u}(t-\tau),$$

where $g_c \doteq 2\lambda_d$ and $g_d \doteq 2\lambda_d$ is the "forgetting" rates with respect to $\{\underline{c}_k\}_{k=1}^{K+1}$ and $\underline{d}$, $\mu_c$ and $\mu_d$ are the learning rates with respect to $\{\underline{c}_k\}_{k=1}^{K+1}$ and $\underline{d}$, and $\tilde{\varepsilon}(t) \doteq u_0(t) - \tilde{y}(t-\tau)$ is the error signal.

The ODEs for the dynamic reservoir and the weight adaptation system can be implemented directly in analog hardware. To implement the above ODEs in software or efficient digital hardware (e.g., field-programmable gate arrays (FPGAs) or custom digital application-specific integrated circuits (ASICs)), the update equations must be discretized. For implementing the process in software or digital hardware, the ODEs are converted to delay difference equations (DDEs). For a linear dynamical system with the state-space representation:

$$\dot{\underline{x}}(t) = \underline{A}\underline{x}(t) + \underline{B}u(t)$$

$$y(t) = \underline{C}(t)^T \underline{x}(t) + D(t)u(t).$$

Given the discrete time-step size τ, the equivalent DDE is obtained that describes the exact same filter dynamics:

$$\underline{x}(t) = e^{\underline{A}\tau}\underline{x}(t-\tau) + \int_{t-\tau}^{t} e^{\underline{A}(t-s)} u(s)\,ds \cdot \underline{B}$$

$$y(t) = \underline{C}(t)^T \underline{x}(t) + D(t)u(t).$$

Figure 11A:
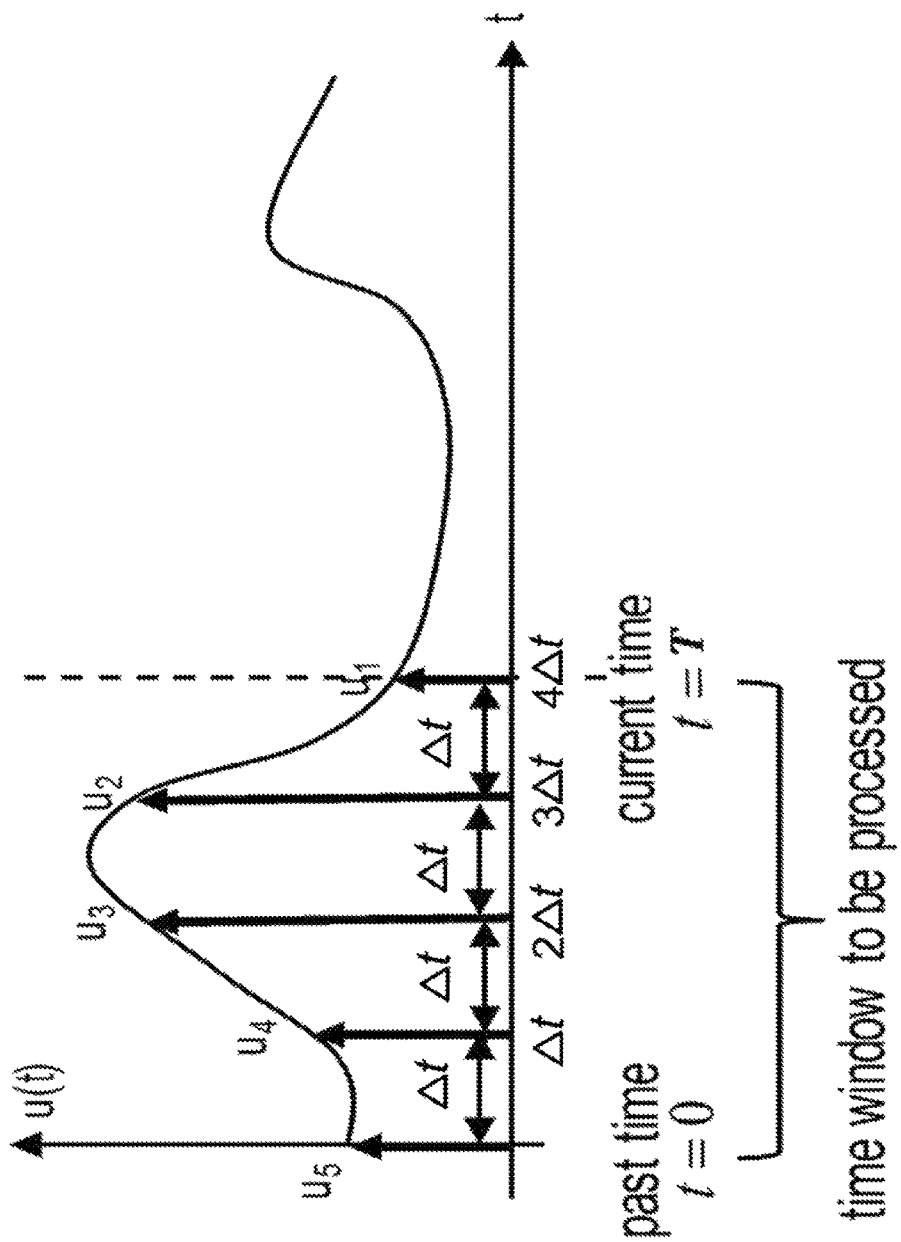
FIG. 11A is a chart illustrating an approximation of the input signal u(t) using uniform sampling at period t.
Figure 11B:
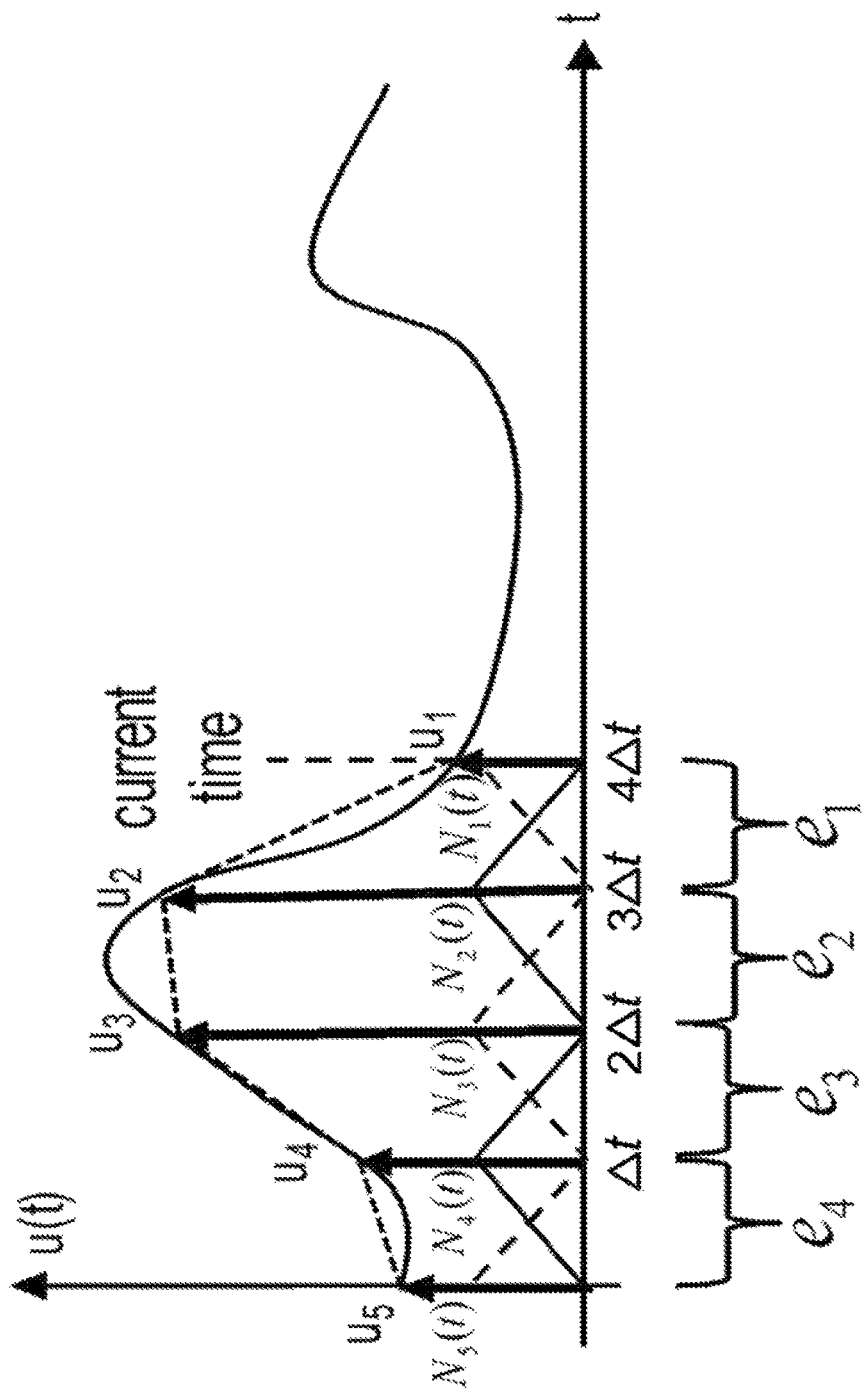
FIG. 11B is a chart illustrating an approximation of the input signal u(t) using a linear basis function.

This shows that the current reservoir state $\underline{x}(t)$ is a function of the reservoir state at the previous time step $\underline{x}(t-\tau)$ and the input signal u(t) over the interval, [t−τ, t]. Since the entire continuous interval, is not available in software or digital hardware, in the digital CSP, u(t) is approximated over the interval using linear basis functions. Given the sampling period Δt, for u(t), a set of samples can be collected as follows: $u_i \doteq u(t-(i-1)\Delta t)$, $1 \leq i \leq n_e+1$, where $$n_e = \frac{\tau}{\Delta t}$$

in the number of sampling intervals within the time window defined by $\tau$ (see FIG. 11A)). As seen in FIG. 11B, the input signal is approximated from the samples as $u(t) \approx \sum_{i=1}^{n_e+1} u_i N_i(t)$, where $N_i(t) = T(t-(i-1)\Delta t)$ is a shifted version of the triangle function $T(t)$:

$$T(t) = \begin{cases} 1 - t/\Delta t & 0 \leq t \leq \Delta t \\ 1 + t/\Delta t & -\Delta t \leq t \leq 0 \\ 0 & \text{otherwise} \end{cases}$$

Based on the linear basis approximation, the DDE for the reservoir state $\underline{x}(t)$ becomes:

$$\underline{x}(t) = e^{\underline{A}\tau}\underline{x}(t-\tau) + \sum_{i=1}^{n_e+1} \left\{ u_i \int_{t-\tau}^{t} e^{\underline{A}(t-s)} N_i(s) ds \cdot \underline{B} \right\}.$$

Without loss of generality, $t=\tau$. If the two auxiliary matrices $\underline{B}_{1e}^i$ and $\underline{B}_{2e}^i$ are defined as follows:

$$\underline{B}_{1e}^i \stackrel{def}{=} e^{\underline{A}(i-1)\Delta t} \int_0^\tau e^{\underline{A}(\tau-s)} N_1(s) ds \cdot \underline{B} = \frac{e^{\underline{A}(i-1)\Delta t}}{\Delta t} \underline{A}^{-2} \left(e^{\underline{A}\Delta t} - \Delta t \underline{A} - I\right) \underline{B}$$

$$\underline{B}_{2e}^i \stackrel{def}{=} e^{\underline{A}(i-1)\Delta t} \int_0^\tau e^{\underline{A}(\tau-s)} N_2(s) ds \cdot \underline{B} =$$

$$e^{\underline{A}(i-1)\Delta t} \left\{ \underline{A}^{-1} \left(e^{\underline{A}\Delta t} - 1\right) - \frac{1}{\Delta t} \underline{A}^{-2} \left(e^{\underline{A}\Delta t} - \Delta t \underline{A} - I\right) \right\} \underline{B},$$

then $\underline{x}(\tau)$ can be computed as:

$$\underline{x}(t) =$$

$$\underline{x}(n_e \Delta t) = \underbrace{e^{\underline{A}\tau}}_{A}\underline{x}(0) + \underbrace{\left[\underline{B}_{1e}^1, (\underline{B}_{2e}^1 + \underline{B}_{1e}^2), \ldots, (\underline{B}_{2e}^{n_e-1} + \underline{B}_{1e}^{n_e}), \underline{B}_{2e}^{n_e}\right]}_{\tilde{B}} \begin{bmatrix} u_1 \\ u_2 \\ \vdots \\ u_{n_e} \\ u_{n_e+1} \end{bmatrix}.$$

Based on this, iterative updates can be derived for the state ($\underline{x}$), output (y), and weights ($\{\underline{c}_k\}_{k=1}^{K+1}$, $\underline{d}$), which is summarized in Algorithm 1 below,

---

Algorithm 1: Iterative algorithm for general discrete time model

---

Initialization:
$\underline{x}[1] = \underline{0}$, $\underline{c}_k[1] = \underline{0}$, $\underline{d}[1] = \underline{0}$  $\quad k = 1, 2, \ldots, (K+1)$ Iteration ($n \geq 2$):

---

Algorithm 1: Iterative algorithm for general discrete time model

---

$\underline{u}[n] = [u_0[n], u_0[n - N_\tau], \ldots, u_0[n - KN_\tau]]^T$ $\underline{x}[n] = \underline{\tilde{A}}\underline{x}[n-1] + \underline{\tilde{B}}u_0[n]$ $\tilde{\varepsilon}[n] = u_0[n] - \sum_{k=1}^{K+1} \underline{c}_k[n-1]^T \underline{x}[n-kN_\tau] + \underline{d}[n-1]^T \underline{u}[n-N_\tau]$ $\underline{c}_k[n] = (1 - \Delta t g_c)\underline{c}_k[n-1] + \Delta t \tilde{\mu}_c \tilde{\varepsilon}[n]\underline{x}[n-kN_\tau] \quad k = 1, 2, \ldots, (K+1)$ $\underline{d}[n] = (1 - \Delta t g_d)\underline{d}[n-1] + \Delta t \tilde{\mu}_d \tilde{\varepsilon}[n]\underline{u}[n-N_\tau]$ $y[n] = \sum_{k=1}^{K+1} \underline{c}_k[n]^T \underline{x}[n-(k-1)N_\tau] + \underline{d}[n]^T \underline{u}[n]$

---

It is noted that the example architecture in FIG. 7 enables the user to select different learning methods governed by local and/or global learning rules. The local/global learning rules are set by selecting which of the two signals is input into the summing junctions 700 and 702 that calculate the error signals $\varepsilon_1(t), \ldots, \varepsilon_N(t)$. Without loss of generality, examine the summing junction 700 corresponding to the first error signal $\varepsilon_1(t) = s_1(t) - fb_1(t)$. In learning method #1 (global learning), the switches to the left and right of the summing junction 700 are both flipped upward, so that $s_1(t) = u_0(t - \tau_{DIS})$ and $fb_1(t) = y(t - \tau_{DOS})$, and thus $\varepsilon_1(t) = u_0(t - \tau_{DIS}) - y(t - \tau_{DOS})$ is the error between the delayed input signal and global output signal. In the global learning mode, each state element is adapted by the same global error function. In learning method #2 (local learning and as shown), the switch to the left and right of the summing junction 700 are flipped downward, so that $s_1(t) = x_1(t)$ and $fb_1(t) = \tilde{x}_1(t - \tau_{DSS})$, and thus $\varepsilon_1(t) = x_1(t) - \tilde{x}_1(t - \tau_{DSS})$ is the error between the predicted state element and delayed version of the actual state element. This same behavior applies for the summing junction 702 corresponding to error signals $\varepsilon_2(t), \ldots, \varepsilon_N(t)$. Since there are only two learning modes, all switches in all of FIG. 7 are either flipped upward or flipped downward.

In the case when the state update error signals are generated from the noisy input state variables and their denoised versions the learning is local and it does not include any information from the output signal. In this case, only the last output layer that combines the de-noised states into the output uses global error, namely the difference between the input and output. For use in this system, the local learning rules are used to ensure that the individual reservoir states, used by the BSS subsystem to develop adaptive FIR filters, are sufficiently de-noised.

In FIG. 7, the input signal $u_0(t)$ is fed into the dynamic reservoir 400, producing the N-dimensional reservoir state vector $\underline{x}(t)$. The elements of the reservoir state vectors $x_1(t), \ldots, x_N(t)$ are each fed individually into their own adaptive signal prediction modules. Without loss of generality, the first element of the reservoir state vector $x_1(t)$ is sent through a length K delay embedding to produce the delay-embedded vector $(x_1(t), x_1(t-\tau_1), \ldots, x_1(t-K\tau_1))$. The delay embedded vector of $x_1(t)$ is combined using adaptable linear mixing weights $C_{11}, \ldots, C_{1K+1}$ and delayed by $\tau_{SK}$ to obtain auxiliary state $\tilde{x}_1(t)$. The linear mixing weights $C_{11}, \ldots, C_{1K+1}$ are adapted via gradient descent using the error signal $\varepsilon_1(t)$ based on the learning modes described above. This process proceeds analogously for each of the reservoir state elements $x_2(t), \ldots, x_N(t)$ to produce auxiliary state elements $\tilde{x}_2(t), \ldots, \tilde{x}_N(t)$. The set of auxiliary states $\tilde{x}_1(t), \ldots, \tilde{x}_N(t)$ are combined using adaptable linear mixing weights $C_{01}, \ldots, C_{0N}$ and delayed by $\tau_{SK}$ to obtain the final output signal y(t). The linear mixing weights $C_{O1}, \ldots, C_{ON}$ are adapted via gradient descent using the error signal $\varepsilon_0(t)=u_0(t-\tau_{DIO})-y(t-\tau_{DOO})$. In the above, the delay parameters $\tau_1, \ldots, \tau_N, \tau_{DIS}, \tau_{DSS}, \tau_{DIO}, \tau_{DOS}, \tau_{DOO}$ can all be adjusted by the user based on the timing requirements of the computing hardware used to instantiate this invention.

(4.5) Blind Source Separation Using Reservoir States

Figure 8:
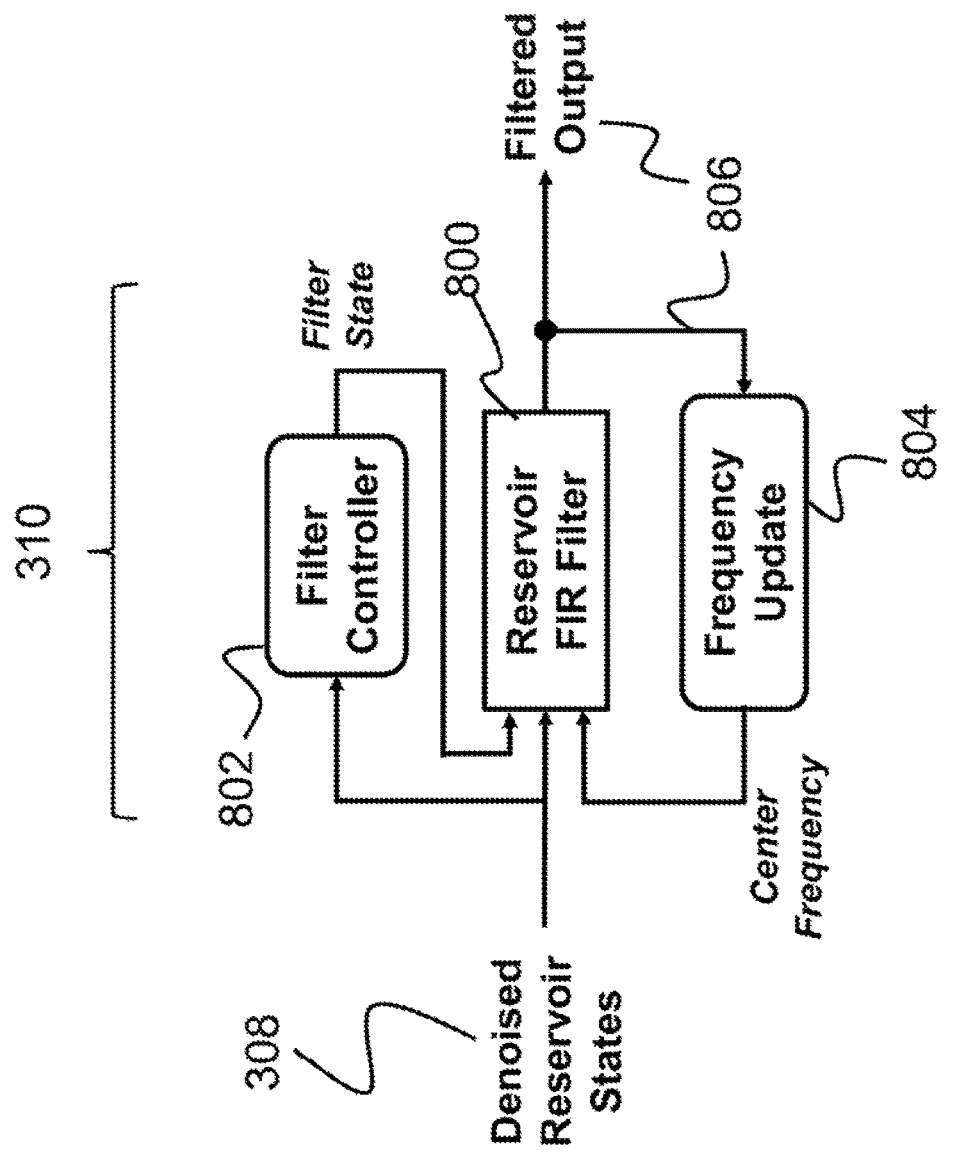
FIG. 8 is an illustration depicting an architecture of blind source separation (BSS) filters according to various embodiments of the present invention that make use of reservoir states.

The architecture for the Blind Source Separation (BSS) filters 310 used to separate and track each pulse from the signal mixture is shown in FIG. 8. The input to this module is the set of denoised reservoir state signals 308. These signals are fed into a Reservoir FIR filter block 800, which implements an FIR filter with a fixed bandwidth and adjustable center frequency by applying a particular set of linear mixing weights to the reservoir state signals. The method for constructing linear mixing weights that, when applied to the reservoir states, implement an FIR filter with a given bandwidth and center frequency is detailed below in Section (4.5.1).

The BSS filters (in the FIR Filter Block 800) extract unique source signals by maximizing the power of each filter output signal. The state of each BSS filter is controlled by a Filter Controller block 802, which measures the power in each reservoir state to determine which BSS filters are actively tracking signals, and which frequency bands within the input signal contain pulses for BSS filters to track. The Frequency Update block 804 accepts the filter output signals 806 as input and uses this information to update the filter center frequencies. The center frequencies of the filters (in the FIR Filter Block 800) are updated with the new center frequencies completing the feedback loop. As the system operates the source signals are extracted and features, such as Pulse Descriptor Words (PDWs), may then be extracted from the separated source signals. The components of the BSS filters 310 are described in further detail below.

(4.5.1) Reservoir State-Based FIR Filters

The first stage of the BSS filter module 310 is a FIR Filter Block 800 which includes a set of adaptable FIR filters. These FIR filters are implemented as linear mixing weights applied to the reservoir state signals (e.g., adaptively filtering) to achieve a desired filter response. Each filter in the bank 800 receives the set of denoised reservoir state signals as input.

The center frequency of each filter is adaptable, while its bandwidth is fixed. As a mixture signal is run through the filters each one adapts in such a way that its center frequency converges on the frequency of a unique source signal. The frequency of a source signal may be a function of time. This system only requires that a source signal be well characterized by a single frequency over any short interval of time.

The power function is a feedback component of this module and is responsible for guiding the adaptation of the filter center frequencies. Conceptually, each filter may be viewed as having its own power function, with all individual power functions having the same form. The power is computed as $p(x,f^i)=\Sigma_{n=t-M}^{t}(h(f^i)*x(n))^2$, where x is the input signal, $h(f^i)$ is the FIR filter with fixed bandwidth and center frequency $f^i$. The objective is to maximize the power, which tends to drive the filter's center frequency towards one of the source signal frequencies. The adaptation for this objective occurs on a fast time-scale in order to cover a very wide bandwidth. The output of the power function is the power signal. The power signal is used to adapt the filter center frequencies and determine the filter states. The power signal is defined as the normalized power of the filter output. The normalized power is given by $$\left[\frac{1}{M}\sum_{n=t-M}^{t}(h(f^i)*x(n))^2\right]/\text{var}(x(t)),$$

where M is the number of samples used in the average, x(t) is the input to the filter, and var(x(t)) is the variance in the input computed over the same M samples.

Described below is the procedure used to determine the pole and zero structure of the filter based on the updated center frequency. A filter is described by the following state space system equations:

$$\dot{x}(t)=Ax(t)+Bu(t)$$

$$y(t)=Cx(t)+Du(t)$$

The poles of the filter are given by the eigenvalues of the reservoir state transition matrix A, while the zeros of the filter can be changed using the other state space system coefficients, B, C, and D. For a passive filter, the matrix A has eigenvalues that are in the left half plane and are either purely real (and negative), or come in complex conjugate pairs. This observation allows the filter structure to be block-diagonalized, so that one consider the system as N independent filters, each with frequency described by the imaginary part of the complex conjugate pairs of A. When the eigenvalues of A all have small real part, corresponding to low-loss systems, the imaginary parts of the eigenvalues determine the resonant frequencies of the filter. To achieve a channelized response, one would like to choose the poles of A based on the expected bandwidth of the input signal. However, because the reservoir state transition matrix is fixed, the filter parameters must be adapted using the C mixing weight matrix.

With the eigenvalues (poles) of A chosen as described above, the invention then uses a numerical minimization procedure to determine the coefficients of C that yield a transfer function that is as close as possible to a desired transfer function with given ripple properties. Because the filter coefficients C undergo further modification in this online learning procedure, one need only to determine initial C coefficients enabling rapid convergence in the feedback scheme. An example output of the optimization procedure for a channelized transfer function with periodic ripple is shown in FIG. 9.

Figure 9:
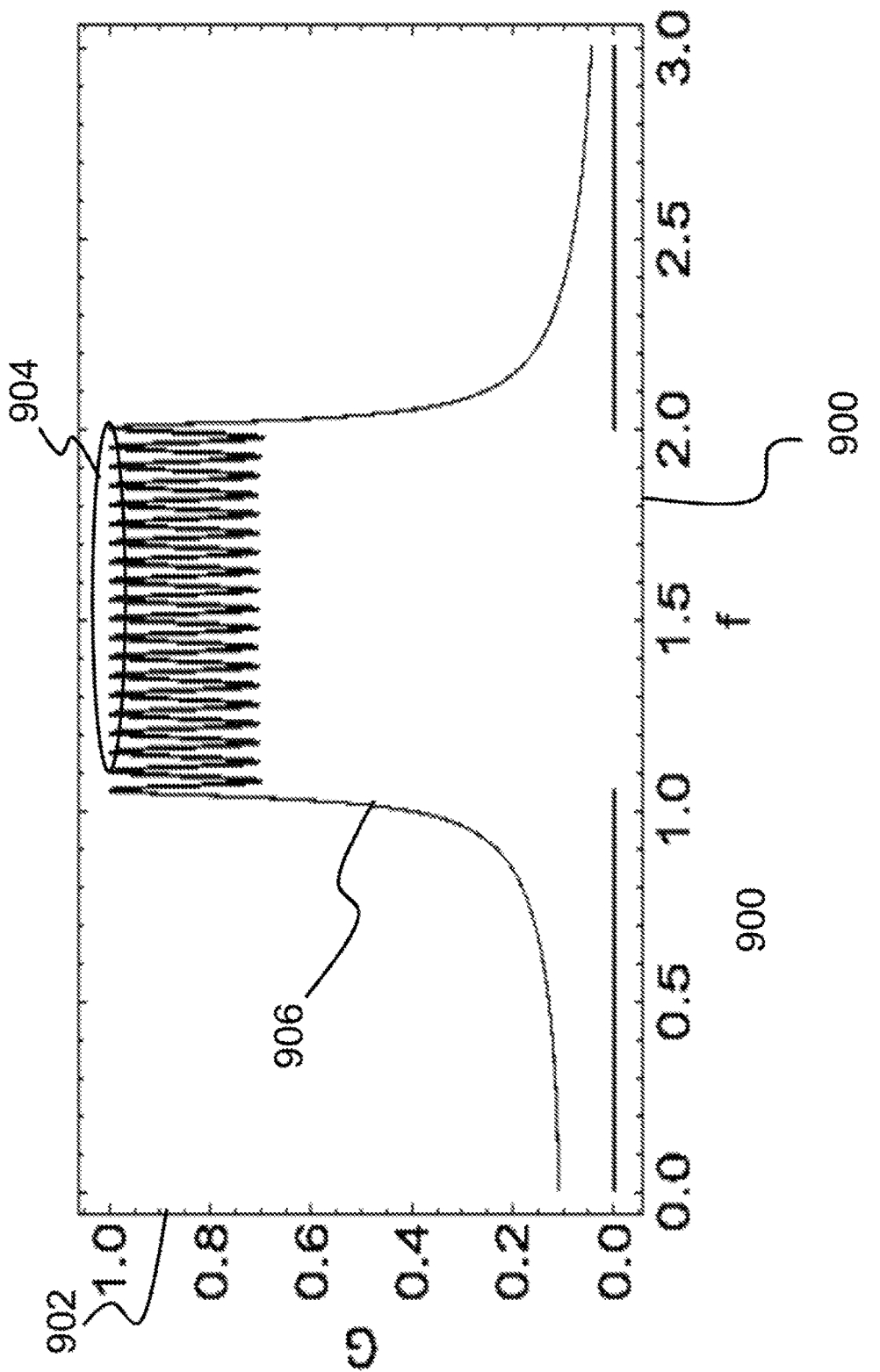
FIG. 9 is a graph depicting an optimal transfer function for an initial state of an adaptive filter.

FIG. 9 is a graph depicting an example optimal transfer function for the initial state of the adaptive filter. Poles are chosen to give 20 channels between frequencies 900 of 1.05 and 2.0 plotted against gain 902. The desired gain 904 varies between 1 and 0.707. The optimal filter is determined by numerical minimization procedure for C coefficients 906.

(4.5.2) Filter Controller

The Filter State Controller 802 is responsible for determining the current state of each filter (in the FIR Filter Block 800). Filters exist in one of three possible states: inactive, tracking, and holding. A filter is in the inactive state when it does not currently have a source signal to extract. A filter is in the tracking state while it is actively extracting a source signal. A filter is in the holding state when it was in the process of extracting a source signal, but lost the signal. The following state transitions are permitted: inactive→inactive, searching→tracking, tracking→tracking, tracking→holding, holding→holding, holding→tracking, holding→inactive.

Figure 10:
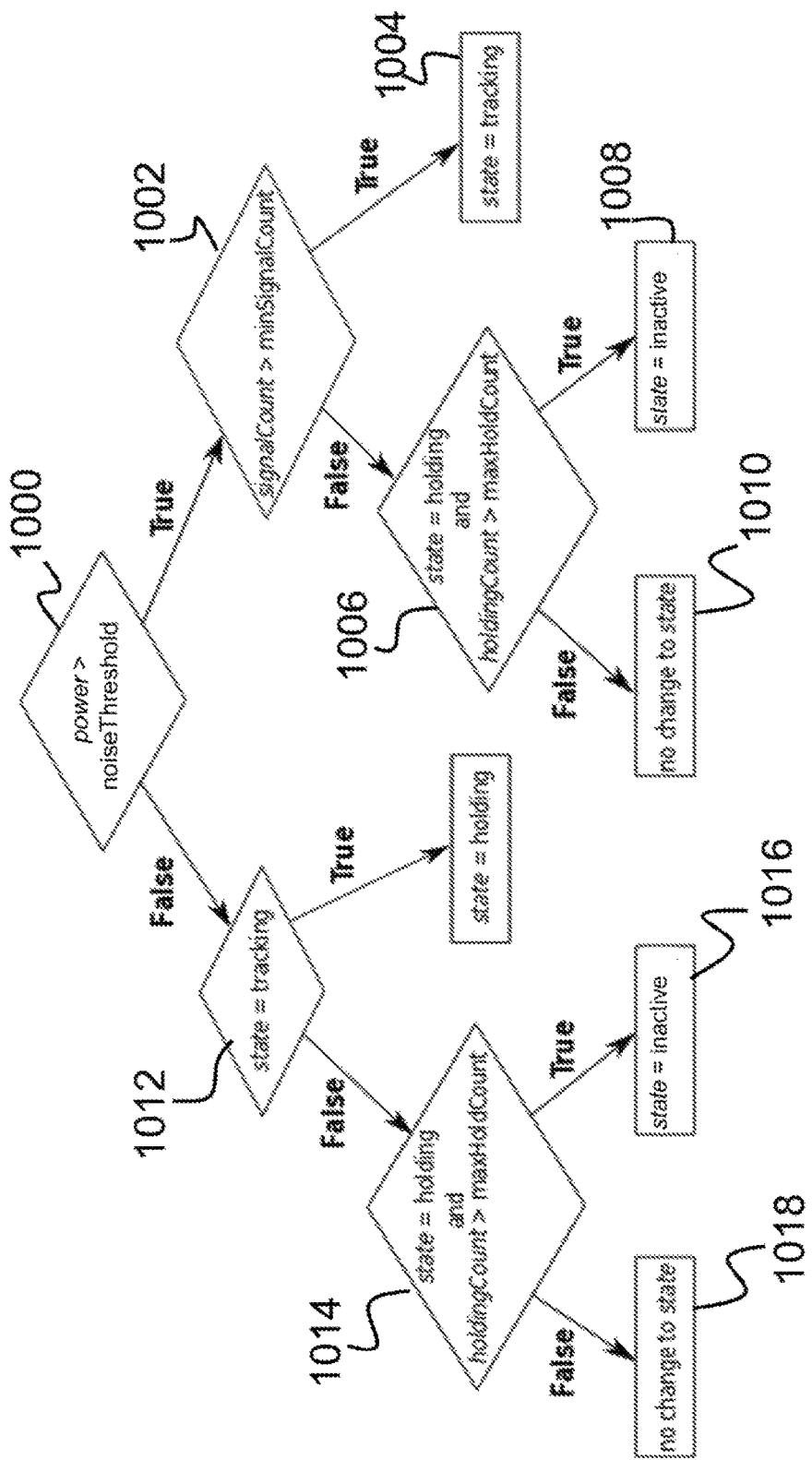
FIG. 10 is a diagram of the filter controller according to various embodiments of the present invention.

FIG. 10 is a diagram of the algorithm implemented by the Filter State Controller. The filter controller uses the power signals derived from the reservoir state signals to update the filter states, power, state, signalCount, and holdingCount are filter-specific variables. noiseThreshold, minSignalCount, and maxHoldCount are fixed numeric parameters that are the same for every filter and are set by the user. A filter may be in one of three possible states: inactive, tracking, and holding. The variables holdingCount and signalCount are specific to each filter.

First, the presence or absence of a signal with respect to a given filter is determined 1000 by thresholding the power as the normalized power of the reservoir state signal. In the presence of signal, the value of this measure will rise above a pre-defined threshold. The threshold (noiseThreshold) is determined by observing the value under pure noise. If the power signal is above the threshold it means that the filter is detecting a source signal in a particular frequency band.

Next, a signalCount is evaluated 1002. The signalCount variable is the number of consecutive time-steps that the reservoir state power signal has been above the threshold. If signalCount is greater than the parameter minSignalCount, then the filter's state is set to tracking 1004 because an actual signal is being observed, not just noise. Otherwise 1006, if the filter's state is holding and the variable holdingCount is greater than the parameter maxHoldCount, then the filter's state is set back to inactive 1008. If this is false, then no change 1010 is made to the filter's state. The variable holdingCount is the number of consecutive time-steps that the filter has been in the holding state. It is used to limit the amount of time that a filter can spend in this state.

If the power signal drops below noiseThreshold and the filter is in the tracking state 1012, then it transitions to the holding state 1014. On the other hand 1016, if it is already in the holding state and holdmgCount is greater than maxHoldCount, the filter transitions back to the inactive state 1016. Otherwise, no change 1018 is made to the filter's state.

(4.5.3) Frequency Update Block

The Filter Center Frequency Adapter is responsible for updating the positions of the filters in the frequency domain by utilizing the filter output power signals. In addition to adapting the filters, it ensures that a filter is able to track a source signal for the duration of at least a single pulse. This way no pulses that are extracted from the mixture signal are split between different filter outputs.

As noted above, each filter exists in one of three states (i.e., inactive, tracking, and holding). In the inactive state, the filter is not tracking any particular signal. Once the filter controller detects that a particular frequency band contains enough power to indicate the presence of a pulse the filter enters the tracking state initialized with a center frequency equal to the resonant frequency of the reservoir state that is above the noiseThreshold, and the filters protected region is set. If during the tracking state a filter loses the signal it was tracking, then it will enter the holding state. In the holding state a filter is held at its current center frequency for a fixed period of time maxHoldCount and the filter's protected region remains in place. A non-limiting example of such a fixed period of time is in an embodiment of a related invention as described in U.S. Non-Provisional application Ser. No. 15/452,155, where maxHoldCount was set to 450 filter outputs, which corresponded to 4500 time steps for an input signal with sampling rate 180 GHz. If during this period of time a signal returns, then the filter is switched back to the tracking state. On the other hand, if after time maxHoldCount no signal has returned, then the filter is switched to the inactive state and its protected region is removed.

The center frequency of the filter can be updated using a combination of a gradient descent algorithm and the Momentum method. A non-limiting example of a gradient descent algorithm is Resilient Propagation (RProp) (see Literature Reference No. 4). RProp uses only the sign information of the gradient rather than its magnitude, making it favorable for limited precision hardware implementation. The RProp update is given by $$f_{t+1} = f_t - d_t \cdot \Delta f_t,$$

where $d_t = \text{sgn}(p(x, f_t + \varepsilon) - p(x, f_t))$ is the sign of the derivative of the filter output power, and $\Delta f_t$ is the frequency increment, $\Delta f_t$ is determined by the sequence of sign changes of the output power derivative:

$$\Delta f_t = \begin{cases} \min(\mu_+(f_t - f_{t-1}), \Delta f_{max}) & d_t \cdot d_{t-1} > 0 \\ \max(\mu_-(f_t - f_{t-1}), \Delta f_{min}) & d_t \cdot d_{t-1} = 0, \\ f_t - f_{t-1} & d_t \cdot d_{t-1} = 0 \end{cases}$$

where $\mu_+$, $\mu_-$, $\Delta f_{max}$, and $\Delta f_{min}$ are user-defined parameters that determine the dynamics of the RPROP update. The Momentum method updates the center frequency by fitting a linear function to some number of past center frequencies and then extrapolating this linear model to the next time-step.

If the filter state is tracking and the variable trackholdCount is greater than the user-specified parameter fitLimit, then both Gradient Descent and Momentum are used to determine the next center frequency. If the filter state is holding, only Gradient Descent is used. The variable trackholdCount is the number of consecutive time-steps that the filter has been in either the tracking or the holding state. The condition trackholdCount>fitLimit allows only those filters that have been tracking a source signal sufficiently long to use the Momentum method. If the suggested next center frequency produced by Gradient Descent is $f_g$ and that suggested by Momentum is $f_m$, then the next center frequency is given by $f_{new} = c_1 * f_g c_2 * f_m$, where $c_1$ and $c_2$ are positive constants such that $c_1 + c_2 = 1$. If $c_1 > c_2$, then there is more emphasis on the portion of the mixture signal that the filter is currently seeing, while if $c_2 > c_1$ the linear trend of past center frequencies plays a stronger role in determining the new frequency. Typically, $c_1 = c_2 = 0.5$. If the filter state is holding and trackholdCount>fitLimit, then sufficient signal tracking has been performed to utilize Momentum to update the center frequency, but a signal is not currently being tracked and thus Gradient Descent is not used. Otherwise, there is no change to the filter center frequency.

(4.6) Control/Source Selector Module

As shown in FIG. 3, the fourth module of the Cognitive Signal Processor is the control/source selector 312. The control/source selector 312 prevents more than one filter from extracting any given source signal at the same time. It enforces the protected region of each filter that is in the tracking or holding state. The protected region is an interval in the frequency domain that is centered on a filter's center frequency. For some embodiments, the center frequency of a filter is not permitted to exist within another filter's protected region. A general policy governing the resolution of conflicts that arise when a filter attempts to move within another filter's protected region is not prescribed since such a policy is dependent on the specifics of the center frequency adaptation algorithm. For example, as illustrated in an embodiment of a related invention as described in U.S. Non-Provisional application Ser. No. 15/452,155, for a input signal sampling rate of 180 Ghz, the closest that a new center frequency suggested by Gradient Descent can be any old center frequency of other filters is 5 GHz. If there is a conflict, then the filter that had the center frequency at the previous time instant is allowed to maintain that center frequency, and the filter that suggested the new center frequency must remain with its current center frequency.

Finally, while this invention has been described in terms of several embodiments, one of ordinary skill in the art will readily recognize that the invention may have other applications in other environments. It should be noted that many embodiments and implementations are possible. Further, the following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means". Further, while particular method steps have been recited in a particular order, the method steps may occur in any desired order and fall within the scope of the present invention.

What is claimed is:

1. A cognitive signal processor for signal denoising and blind source separation, the cognitive signal processor comprising:
    one or more processors configured to perform operations of:
        receiving a mixture signal that comprises a plurality of source signals;
        generating a denoised reservoir state signal by mapping the mixture signal to a dynamic reservoir to perform signal denoising; and
        identifying at least one separated source signal by adaptively filtering the denoised reservoir state signal;
    wherein adaptively filtering the denoised reservoir state signal further comprises operations of:
        detecting that a particular frequency band possesses a pulse;
        switching a first filter to a tracking state with a center frequency equal to a resonant frequency of a reservoir state corresponding to the particular frequency band; and
        setting the center frequency of the first filter as a protected region to prevent other filters within a bank of filters from sharing the center frequency.

2. The cognitive signal processor as set forth in claim 1, wherein filtering the denoised reservoir state signal is performed with a bank of filters.

3. The cognitive signal processor as set forth in claim 2, further comprising an operation of controlling the bank of filters to cause each filter within the bank of filters to filter a unique waveform.

4. The cognitive signal processor as set forth in claim 3, wherein each filter has an adaptable center frequency.

5. The cognitive signal processor as set forth in claim 1, wherein adaptively filtering the denoised reservoir state signal further comprises operations of:
    switching the first filter to a holding state if the first filter loses the pulse of the particular frequency band;
    maintaining the first filter in the holding state for a fixed period of time while maintaining the protected region;
        if during the fixed period of time the pulse returns, switching the first filter to the tracking state, otherwise switching the first filter to an inactive state and removing the protected region.

6. The cognitive signal processor as set forth in claim 1, wherein generating the denoised reservoir state signal further comprises delay embedding the reservoir state signal to generate a reservoir state history.

7. The cognitive signal processor as set forth in claim 1, wherein generating the denoised reservoir state signal further comprises generating a predicted input signal a small-time step ahead of the mixture signal, wherein an error between the predicted input signal and mixture signal is used to update output weights of the dynamic reservoir.

8. The cognitive signal processor as set forth in claim 1, wherein generating the denoised reservoir state signal is performed with a dynamic reservoir implemented in analog hardware by satisfying a set of ordinary differential equations.

9. A cognitive signal processor for signal denoising and blind source separation, the cognitive signal processor comprising:
    one or more processors configured to perform operations of:
        receiving a mixture signal that comprises a plurality of source signals;
        generating a denoised reservoir state signal by mapping the mixture signal to a dynamic reservoir to perform signal denoising; and
        identifying at least one separated source signal by adaptively filtering the denoised reservoir state signal;
    wherein generating the denoised reservoir state signal is performed with a dynamic reservoir implemented in software or digital hardware by converting a set of ordinary differential equations to delay difference equations.

10. A computer program product for signal denoising and blind source separation, the computer program product comprising:
    a non-transitory computer-readable medium having executable instructions encoded thereon, such that upon execution of the instructions by one or more processors, the one or more processors perform operations of:
        receiving a mixture signal that comprises a plurality of source signals;
        generating a denoised reservoir state signal by mapping the mixture signal to a dynamic reservoir to perform signal denoising; and
        identifying at least one separated source signal by adaptively filtering the denoised reservoir state signal;
    wherein adaptively filtering the denoised reservoir state signal further comprises operations of:
        detecting that a particular frequency band possesses a pulse;

switching a first filter to a tracking state with a center frequency equal to a resonant frequency of a reservoir state corresponding to the particular frequency band; and setting the center frequency of the first filter as a protected region to prevent other filters within a bank of filters from sharing the center frequency.

11. The computer program product as set forth in claim 10, wherein filtering the denoised reservoir state signal is performed with a bank of filters.

12. The computer program product as set forth in claim 11, further comprising an operation of controlling the bank of filters to cause each filter within the bank of filters to filter a unique waveform.

13. The computer program product as set forth in claim 12, wherein each filter has an adaptable center frequency.

14. The computer program product as set forth in claim 10, wherein adaptively filtering the denoised reservoir state signal further comprises operations of:
switching the first filter to a holding state if the first filter loses the pulse of the particular frequency band;
maintaining the first filter in the holding state for a fixed period of time while maintaining the protected region;
if during the fixed period of time the pulse returns, switching the first filter to the tracking state, otherwise switching the first filter to an inactive state and removing the protected region.

15. The computer program product as set forth in claim 10, wherein generating the denoised reservoir state signal further comprises delay embedding the reservoir state signal to generate a reservoir state history.

16. The computer program product as set forth in claim 10, wherein generating the denoised reservoir state signal further comprises generating a predicted input signal a small-time step ahead of the mixture signal, wherein an error between the predicted input signal and mixture signal is used to update output weights of the dynamic reservoir.

17. The computer program product as set forth in claim 10, wherein generating the denoised reservoir state signal is performed with a dynamic reservoir implemented in analog hardware by satisfying a set of ordinary differential equations.

18. A computer program product for signal denoising and blind source separation, the computer program product comprising:
a non-transitory computer-readable medium having executable instructions encoded thereon, such that upon execution of the instructions by one or more processors, the one or more processors perform operations of:
receiving a mixture signal that comprises a plurality of source signals;
generating a denoised reservoir state signal by mapping the mixture signal to a dynamic reservoir to perform signal denoising; and
identifying at least one separated source signal by adaptively filtering the denoised reservoir state signal;
wherein generating the denoised reservoir state signal is performed with a dynamic reservoir implemented in software or digital hardware by converting a set of ordinary differential equations to delay difference equations.

19. A computer implemented method processor for signal denoising and blind source separation, the method comprising an act of:
causing one or more processors to execute instructions encoded on a non-transitory computer-readable medium, such that upon execution, the one or more processors perform operations of:
receiving a mixture signal that comprises a plurality of source signals;
generating a denoised reservoir state signal by mapping the mixture signal to a dynamic reservoir to perform signal denoising; and
identifying at least one separated source signal by adaptively filtering the denoised reservoir state signal;
wherein adaptively filtering the denoised reservoir state signal further comprises operations of:
detecting that a particular frequency band possesses a pulse;
switching a first filter to a tracking state with a center frequency equal to a resonant frequency of a reservoir state corresponding to the particular frequency band; and
setting the center frequency of the first filter as a protected region to prevent other filters within a bank of filters from sharing the center frequency.

20. The computer implemented method as set forth in claim 19, wherein filtering the denoised reservoir state signal is performed with a bank of filters.

21. The computer implemented method as set forth in claim 20, further comprising an operation of controlling the bank of filters to cause each filter within the bank of filters to filter a unique waveform.

22. The computer implemented method as set forth in claim 21, wherein each filter has an adaptable center frequency.

23. The computer implemented method as set forth in claim 19, wherein adaptively filtering the denoised reservoir state signal further comprises operations of:
switching the first filter to a holding state if the first filter loses the pulse of the particular frequency band;
maintaining the first filter in the holding state for a fixed period of time while maintaining the protected region;
if during the fixed period of time the pulse returns, switching the first filter to the tracking state, otherwise switching the first filter to an inactive state and removing the protected region.

24. The computer implemented method as set forth in claim 19, wherein generating the denoised reservoir state signal further comprises delay embedding the reservoir state signal to generate a reservoir state history.

25. The computer implemented method as set forth in claim 19, wherein generating the denoised reservoir state signal further comprises generating a predicted input signal a small-time step ahead of the mixture signal, wherein an error between the predicted input signal and mixture signal is used to update output weights of the dynamic reservoir.

26. The computer implemented method as set forth in claim 19, wherein generating the denoised reservoir state signal is performed with a dynamic reservoir implemented in analog hardware by satisfying a set of ordinary differential equations.

27. A computer implemented method processor for signal denoising and blind source separation, the method comprising an act of:
causing one or more processors to execute instructions encoded on a non-transitory computer-readable medium, such that upon execution, the one or more processors perform operations of:

receiving a mixture signal that comprises a plurality of source signals;

generating a denoised reservoir state signal by mapping the mixture signal to a dynamic reservoir to perform signal denoising; and identifying at least one separated source signal by adaptively filtering the denoised reservoir state signal;

wherein generating the denoised reservoir state signal is performed with a dynamic reservoir implemented in software or digital hardware by converting a set of ordinary differential equations to delay difference equations.

* * * * *